United States Patent [19]
Shih et al.

[11] Patent Number: 5,949,820
[45] Date of Patent: Sep. 7, 1999

[54] METHOD FOR OPTIMIZING AN EQUALIZATION AND RECEIVE FILTER

[75] Inventors: Shih-Ming Shih; Hemant K. Thapar, both of San Jose, Calif.

[73] Assignee: NEC Electronics Inc., Santa Clara, Calif.

[21] Appl. No.: 08/690,950

[22] Filed: Aug. 1, 1996

[51] Int. Cl.[6] .................................................. H03H 7/30
[52] U.S. Cl. ............................................. 375/229; 360/65
[58] Field of Search .................................... 375/229, 232, 375/350; 360/46, 65

[56] References Cited

U.S. PATENT DOCUMENTS

| | | | |
|---|---|---|---|
| 4,015,238 | 3/1977 | Davis ........................... 340/146.1 AQ |
| 4,571,734 | 2/1986 | Dolivo et al. .............................. 375/18 |
| 4,609,907 | 9/1986 | Adler et al. .............................. 340/347 |
| 4,644,564 | 2/1987 | Dolivo et al. .............................. 375/18 |
| 4,829,575 | 5/1989 | Lloyd ........................................ 381/41 |
| 5,027,374 | 6/1991 | Rossman ................................. 375/94 |
| 5,196,849 | 3/1993 | Galbraith ................................. 341/59 |
| 5,220,294 | 6/1993 | Ichikawa ................................. 331/17 |
| 5,220,466 | 6/1993 | Coker et al. ............................. 360/46 |
| 5,233,482 | 8/1993 | Galbraith et al. ........................ 360/46 |
| 5,241,309 | 8/1993 | Cideciyan et al. ...................... 341/59 |
| 5,258,933 | 11/1993 | Johnson et al. ......................... 364/602 |
| 5,276,408 | 1/1994 | Norimatsu ................................. 331/8 |
| 5,291,499 | 3/1994 | Behrens et al. .......................... 371/43 |
| 5,341,387 | 8/1994 | Nguyen .................................... 371/45 |
| 5,359,631 | 10/1994 | Behrens et al. ......................... 375/120 |
| 5,375,145 | 12/1994 | Abbott et al. ............................. 375/98 |
| 5,408,502 | 4/1995 | How ......................................... 375/340 |
| 5,408,503 | 4/1995 | Kahlman .................................. 375/340 |
| 5,410,556 | 4/1995 | Yeh et al. ................................. 371/43 |
| 5,412,669 | 5/1995 | Foland, Jr. ................................ 371/43 |
| 5,414,738 | 5/1995 | Bienz ....................................... 375/341 |
| 5,418,795 | 5/1995 | Itakura et al. ............................ 371/30 |
| 5,422,760 | 6/1995 | Abbott et al. ............................. 360/46 |
| 5,430,768 | 7/1995 | Minuhin et al. ......................... 375/340 |
| 5,432,804 | 7/1995 | Diamondstein et al. ................. 371/43 |
| 5,432,820 | 7/1995 | Sugawara et al. ....................... 375/341 |
| 5,436,932 | 7/1995 | Sogo et al. .............................. 375/341 |
| 5,438,460 | 8/1995 | Coker et al. ............................. 360/46 |
| 5,444,721 | 8/1995 | Okanoue et al. ........................ 371/43 |
| 5,446,746 | 8/1995 | Park ......................................... 371/43 |
| 5,450,445 | 9/1995 | Ushirokawa ............................ 375/324 |
| 5,453,997 | 9/1995 | Roney, IV ................................ 371/41 |
| 5,459,679 | 10/1995 | Ziperovich ............................. 361/602 |
| 5,461,644 | 10/1995 | Bergmans et al. ...................... 375/341 |
| 5,469,452 | 11/1995 | Zehavi ..................................... 371/43 |
| 5,502,735 | 3/1996 | Cooper .................................... 371/43 |
| 5,504,984 | 4/1996 | Niyogi et al. ........................... 375/341 |
| 5,508,993 | 4/1996 | Hayashi et al. ......................... 369/124 |
| 5,509,020 | 4/1996 | Iwakiri et al. ........................... 371/43 |
| 5,521,945 | 5/1996 | Knudson ................................. 375/341 |
| 5,539,780 | 7/1996 | Dutkiewicz ............................. 375/340 |

OTHER PUBLICATIONS

"Timing Recovery in Digital Synchronous Data Receivers", Kurt H. Mueller and Markus Muller, IEEE Transactions on Communications, vol. COM–24, No. 5, pp. 516–531 (May 1976).

"Fast Timing Recovery for Partial–Response Signalling Systems", F. Dolivo, W. Schott and G. Ungerbock, IBM Research Division, Zurich Research Laboratory, pp. 0573–0575, 0577 (1989) IEEE.

(List continued on next page.)

Primary Examiner—Temesghen Ghebretinsae
Attorney, Agent, or Firm—Skjerven, Morril, MacPherson Franklin and Friel; Alan H. MacPherson

[57] ABSTRACT

Apparatus and Methods are disclosed for adaptively optimizing an ER filter in a readback system of a storage device, such as a disk drive. A sample value is read from the storage device and an error measure is calculated between the sample value and an ideal value. Pole parameters and zeros of the ER filter are modified to minimize the ER filter. The apparatus and methods disclosed can function with customer data to adaptively optimize the ER filter in real time during normal operation of the storage device. Furthermore, temperature compensation circuits are disclosed to compensate for temperature dependencies in the ER filter.

3 Claims, 12 Drawing Sheets

OTHER PUBLICATIONS

"Fully Integrated Analog Filters Using Bipolar–JFET Technology", Khen–Sang Tan and Paul R. Gray, IEEE Journal of Solid–State Circuits, vol. SC–13, No. 6, Dec. 1978 (1978).

"The Viterbi Algorithm", G. David Forney, Jr., Proceedings of the IEEE, vol. 61, No. 3, pp. 268–278 (1976).

"Turbo–PRML: A Compromise EPRML Detector", Roger Wood, IEEE Transactions on Magnetics, vol. 29, No. 6, pp. 4018–4020 (Nov. 1993).

"Implementation of a Digital Read/Write channel with EEPR4 Detection", Dave Welland et al., IEEE Transactions on Magnetics, vol. 31, No. 2 (Mar. 1995).

"A High Speed, Low Power PRML Read Channel Device", Jeff Sonntag et al., IEEE Transactions on Magnetics, vol. 31, No. 2, pp. 1186–1195 (Mar. 1995).

"Improving Performance of PRML/EPRML through Noise Prediction", Evangelos Eleftheriou et al., Presented at Intermag96 International Magnetics Conference, pp. 1–3 (1996).

"An Experimental 180 Mb/sec PRML Channel for Magnetic Recording", John Hong et al., IEEE Transactions on Magnetics, vol. 27, No. 6, pp. 4532–4537 (Nov. 1991).

"A 3.0 V 40 Mb/s hard Disk Drive Read Channel IC", Geert A. De Veirman et al., IEEE Journal of Solid–State Circuits, vol. 30, No. 7, pp. 788–799 (Jul. 1995).

"Exact Bounds for Viterbi Detector Path Metric Differences", Paul H. Seigal et al., pp. 1093–1096, (1991).

"Analog Front–End Architectures for High–Speed PRML Magnetic Read Channels", Patrick K.D. Pai et al., IEEE Transactions on Magnetics, vol. 31, No. 2, (Mar. 1995).

"Implementation of PRML in a Rigid Disk/Drive", J.D. Coker et al., IEEE Transactions on Magnetics, vol. 27, No. 6, pp. 4538–4543, (Nov. 1993).

"A Class of Partial Response Systems for Increasing Storage Density in Magnetic Recording", H.K. Thapar et al., IEEE Transactions on Magnetics, vol. Mzag. 23, No. 5, pp. 3666–3668 (Sep. 1987).

"Integrating a Partial Response Maximum Likelihood Data Channel into the IBM 0681 Disk Drive", J.C. Coker et al., Presented at the Twenty–Fourth Asilmor Conference on Signals, Systmes & Computers, pp. 674–677, (1990).

"A PRML System for Digital Magnetic Recording", Roy D. Cideciyan et al., IEEE Journal on Selected Areas in Communications, vol. 10, No. 1, pp. 38–56 (Jan. 1992).

"A Survey of Digital Phase–Locked Loops", William C. Lindsey et al., Proceedings of the IEEE, vol. 69, No. 4, pp. 410–431 (Apr. 1981).

"Design and Performance of a VLSI 120 Mb/s Trellis–Coded Partial Response Channel", J.W. Rae et al., IEEE Transactions on Magnetics, vol. 31, No. 2, pp. 1208–1214, (Mar. 1995).

"Error Rate Performance of Experimental Gigabit Per Square Inch Recording Components", Thomas D. Howell et al., IEEE Transactions on Magnetics, vol. 26, No. 5, pp. 2298–2302 (Sep. 1990).

"Parallelism in Analog and Digital PRML Magnetic Disk Read Channel Equalizers", Gregory T. Uehara and Paul R. Gray, IEEE Transcactions on Magnetics, vol. 31, No. 2, pp. 1174–1179 (Mar. 1995).

"PERD: Partial Error Response Detection", Takushi Nishiya et al., IEEE Transactions on Magnetics, vol. 31, No. 6, pp. 3042–3044 (Nov. 1995).

"PRML: A Practical Approach", Alexander Teratorin, Guzik Technical Enterprises, pp. 1–93 (1995).

"Realization of a 1–V Active Filter Using a Linearization Technique Employing Plurality of Emitter–Coupled Pairs", Hiroshi Tanimoto et al., IEEE Solid–State Circuits, vol. SC–26, No. 7 pp. 937–945 (Jul. 1991).

"HD153061TF 130–Mbps PRNL Data Channel Processor", Hitachi Advance Information, pp. 1–3, 29–34, (Jul. 1995).

"A Digital Chip with Adaptive Equalizer for PRML Detection in Hard–Disk Drives", William L. Abbott et al., ISSC94, Session 17, Disk–Drive Electronics, Paper FA 17.5 pp. 284–285 (1994).

"A 16MB/s PRML Read/Write Data Channel", Raymond A, Richetta et al., ISSCC95, Session 5, Disk and Arithmetic Signal Processor, Paper WP 5.1, pp. 78–79 and 58–59 (1995).

"Reduced Complexity Viterbi Detector Architectures for Partial Response Signalling", Gerhard Fettweis et al., Paper presented at Globecom Conference '95, pp. 559–563 (1995).

"Improving Performance of PRML/EPRML Through Noise Prediction", E. Eleftheriou and W. Hirt, IBM Research Division, (1996).

"Reduced Complexity Viterbi Detector Architectures for Partial Response Signalling", Gerhard Fettweis et al., IBM Research Division, pp. 1–2, 4, 6, 8, 10, 12, 14, 16, 18, 20, 22, 24, 26, 28, 30 (1995).

METHOD FOR OPTIMIZING AN EQUALIZATION AND RECEIVE FILTER

CROSS-REFERENCE TO RELATED APPLICATIONS

This application relates to the application Ser. No. 08/693,587, now U.S. Pat. No. 5,796,358 (Attorney Reference No: M-3712), filed Aug. 1, 1996, entitled "METHODS AND STRUCTURE FOR SAMPLED-DATA TIMING RECOVERY WITH REDUCED COMPLEXITY AND LATENCY" of Shih-Ming Shih, Tzu-wang Pan, and Jenn-Gang Chern, owned by the assignee of this application and incorporated herein by reference.

This application relates to the application Ser. No. 08/695,327, now U.S. Pat. No. 5,808,573 (Attorney Reference No: M-3711), filed Aug. 1, 1996, entitled "METHODS AND STRUCTURE FOR SAMPLED-DATA TIMING RECOVERY WITH REDUCED COMPLEXITY AND LATENCY" of Shih-Ming Shih, Tzu-wang Pan, and Jenn-Gang Chern, owned by the assignee of this application and incorporated herein by reference.

BACKGROUND OF THE INVENTION

1. Field of Invention

This invention relates to a method and system for equalizing a readback signal to a partial response target. More specifically, this invention relates to a method and system for optimizing a combined equalization and receive filter with programmable or adaptive parameters that can be adjusted for multi-rate operation and for slow time-varying channels.

2. Description of Related Art

Digital magnetic and optical storage applications involve the recording of digital sequences onto the media and the retrieval of such sequences from an analog signal, sensed by the readback head and corrupted by noise, interference, and distortion. The fundamental design goal is to achieve the highest recording density per unit area while maintaining an acceptable probability of error between the recorded sequence and the retrieved sequences. In order to achieve the design goal, read/write channels use a combination of coding and equalization approaches. Each of these functions are reviewed below.

Run-Length Limited (RLL) Codes

Digital magnetic and optical storage devices use RLL codes to improve signal detectability or insure frequent updates to the timing and gain loops, or both. The RLL codes are generally characterized by two parameters, d and k, which control, respectively, the minimum and the maximum number of symbol intervals between successive transitions in the binary input signal. For a given value of d, the RLL code insures that there are at least (d+1), and at most (k+1), symbol intervals between successive transitions. Commonly used codes in magnetic and optical storage products include codes with (d, k) constraints of (1, 7) and (2, 7). These codes are typically used with the peak detection method. The k constraint insures that a non-zero channel output is produced with some minimum frequency to maintain robust operation of timing and gain loops. The d constraint helps signal detectability with peak detection. With the growing interest in Partial Response Maximum Likelihood (PRML) techniques, d=0 codes are gaining in popularity because of their inherently higher code rates.

Partial Response Signaling

One of the fundamental effects that limits the recording density in magnetic and optical recording systems is intersymbol interference (ISI). This effect is due to the bandlimited nature of the head/media combination and results in the overlap of responses due to sequentially recorded transitions on the media. That is, at a given instant in time, the output signal from the medium is composed of not only the response due to the input symbol at that instant, but also the responses from some previously recorded symbols. The amount and the span of this overlap increases as the linear recording density is increased, giving rise to overlap patterns among symbols that are generally very complex and difficult to unravel with a simple device.

In order to reduce the complexity required to unravel the ISI effect, the readback signal is first equalized to a prescribed Partial Response (PR) signal. PR signals have the feature that allows for controlled overlap (or interference) of responses in the output signal due to successive input symbols. The a priori knowledge of the controlled ISI after the equalizer results in a significant reduction in the complexity of the required detector relative to that for the unequalized signal.

As shown in FIG. 1, analog readback signal on output terminal 104 of head/media/preamp 102 is sent to an input terminal of equalizer 106. Equalizer 106, also known as the PRML receiver, equalizes the readback signal to create an equalized signal on output terminal 108 of equalizer 106. The equalized signal should be a suitable PR signal.

A commonly-used PR target signal in data communications and in digital magnetic recording systems is characterized by the transfer polynomial $P(D)=1-D^2$, where D represents the transform of the unit symbol delay operation. This PR signal is commonly referred to as "Class IV PR" or modified duobinary signaling. The noise-free output response at a suitably prescribed sampling instant for Class IV PR is given by $y(kT)=a(kT)-a[(k-2)T]$, n=2,3, . . . , where a(kT) is the input symbol at time instant kT, usually picked from a binary alphabet, $\{0, 1\}$ or $\{1, -1\}$. That is, the output sample at time instant nT involves the overlap of two input symbols, a(nT) and a[(n-2)T].

The equalized signal on output terminal 108 of equalizer 106 is detected using a sequence detector such as Viterbi detector 110, which is based on the Viterbi algorithm. This combination of Class IV partial response with Viterbi detection is commonly referred to in the magnetic recording community by the acronym PRML for "Partial Response Maximum-Likelihood".

The choice of the PR target signal is not unique, but dictated by the operating linear density. Many well known PR targets exist for the magnetic recording application. These targets are now commonly referred to as the "Extended Class IV" family of PR signals. The Extended Class IV family of signals is defined by the polynomials $P(D)=(1-D)(1+D)^n$, where n is a suitably chosen non-negative integer. Note that n=1 yields the standard Class IV PR signal; n=2 is commonly referred to as EPR4; and n=3 is referred to as $E^2PR4$, and so on.

Equalization Methods

As shown in FIG. 2, typical methods to implement equalizer 106 use continuous-time filter 210 as a receive filter which performs anti-aliasing and "coarse" equalization in conjunction with linear discrete time filter 230 as an equalizing filter, which performs equalization to the desired target response. Quantizer 220 is used to convert the output of continuous-time filter 210 into a discrete time signal. The readback signal from head/media/preamp 102 is applied to continuous-time filter 210 to band limit the input noise. If sampled-analog signal processing is used quantizer 220 is a sample-and-hold circuit. For digital signal processing techniques quantizer 220 is an analog-to-digital converter. Linear discrete-time filter 230 performs the actual equalization function, which is a key processing step in PR receivers. Linear discrete-time filter 230 can be implemented by various means, including finite impulse response (FIR) filters, tapped-delay-lines, or transversal filters. Increasingly, PRML read channels for magnetic disk-drives have used an FIR filter for equalization. The FIR filter takes a predetermined number of successive sample values of readback signal 104, scales each sample value by a prescribed amount, and then sums up the scaled values to form the filter output. The scaling factor is often referred to as the tap weight or the filter coefficient.

The FIR structure allows the filter response to be changed easily by changing the filter coefficients. Indeed, the coefficients may be changed in near-real-time or in real-time using an adaptive algorithm. This feature renders the FIR structure well-suited for applications involving multi-rate signal processing and "time varying" channels, as is the case in magnetic disk-drive systems.

The complexity of the PRML read channel depends heavily upon the implementation of equalizer 106. If a FIR structure is used the complexity of the PRML read channel depends upon the number of tap weights required, which depends on the operating linear density for a given head/medium combination and the transfer function of continuous-time filter 210.

Typically, continuous-time filter 210 is chosen to be a low-pass filter and linear discrete-time filter 230 is a sampled-analog FIR filter. Thus all of the equalization is performed in the sampled-analog FIR filter with up to 10 tap weights. In order to reduce the number of tap weights, the equalization function may be partitioned between the continuous-time filter and the FIR filter.

The use of an FIR filter creates many difficulties. For example, a digital FIR requires a large area on an integrated circuit which reduces the level of integration possible. Furthermore, the digital FIR has high power usage making it unsuitable for use with power constrained devices such as portable computers. In addition, to obtain the necessary resolution, a large number of tap weights is required. Optimization of all of the tap weights is very complex and time consuming, which renders a FIR filter unsuitable for real time adaptive uses.

The conventional continuous time filter and the conventional linear discrete-time filter can be replaced with an equalization and receive (ER) filter, which is a single continuous-time filter performing the functions of the conventional continuous time filter and the conventional linear discrete-time filter. By using the ER filter, the FIR filter used in previous architectures to equalize the readback signal is eliminated, thereby simplifying the method and system of generating the EPR4 signal.

The ER filter is characterized most generally by the transfer function, H(s):

$$H(s) = \frac{\prod (s - z_1)}{\prod (s - p_1)} \quad (1)$$

where s is the complex Laplace variable (=$j\omega$), and $z_1$ and $p_j$ are, respectively, the zeros and the poles of the transfer function. The number of zeros, usually two to four, is typically smaller than the number of poles, usually six to eight.

The ER filter design problem involves the determination of the poles and zeros to achieve the EPR4 target output. It can be solved by choosing a suitable optimization technique to minimize an error measure. For example, one can minimize the mean squared-error between $H(j\omega)$ and the desired transfer function, $D(j\omega)$, given by $$D(j\omega) = \frac{T(j\omega)}{C(j\omega)} \quad (2)$$

where $T(j\omega)$ is the target EPR4 pulse response spectrum, given by 2 sin ($\omega$T) cos ($\omega$T/2), and $C(j\omega)$ is the overall pulse response spectrum of the channel (head/medium/preamp/VGA) at the input of the ER filter. The function $C(j\omega)$ may be determined using a suitable channel identification method.

In disk-drive applications, the function $C(j\omega)$ is generally not available and it is also not feasible to explicitly determine $C(j\omega)$ during manufacturing. However, the simplified means of generating the EPR4 signal using a single continuous-time filter still applies with a modified procedure for determining the poles and zeros of the transfer function in near real-time.

FIG. 3 shows a system capable of optimizing ER filter 310, having a transfer function H(s) given in equation (1). A known signal a(kT) is written to the storage device, which could be for example a disk drive. Known signal a(kT) is a discrete time signal having an interval T between samples. Known signal a(kT) should be aperiodic and relatively random to provide a diverse range of samples. A pseudo random signal can be created using a shift register and a generating polynomial such as $X^7 \oplus X^4 \oplus 1$. Known signal a(kT) is converted to known signal d(kT) by the appropriate Class IV PR transfer function. For example in EPR4 d(kT) is given by the equation:

$$d(kT)=a[kT]+a[(k-1)T]-a[(k-2)T]-a[(k-3)T] \quad (3)$$

Known signal a(kT) is read from the storage device as a known unequalized signal on input terminal 305 of ER filter 310. The unequalized signal is equalized by ER filter 310 to produce an equalized signal on output terminal 315 of ER filter 310. The equalized signal is received on input terminal 321 of analog to digital converter 320. The equalized signal is sampled and digitized by analog to digital converter 320 to produce a discrete time digital equalized signal on output terminal 325 of analog to digital converter 320. The discrete time digital equalized signal is also called digital equalized signal y(kT) and has the same interval T between samples as known signal a(kT) and known signal d(kT). Adder 330 subtracts known signal d(kT) on negative input terminal 331 of adder 330 from digital equalized signal y(kT) on positive input terminal 332 of adder 339 to produce error signal e(kT) on output terminal 333 of adder 330.

Error signal e(kT) is used by optimizer 340 to calculate the mean square error of digital equalized signal y(kT). Optimizer 340 then optimizes the location of the poles and zeros of ER filter 310 based on the mean square error using standard gradient methods. Alternatively, optimizer 340 can optimize the coefficients of the polynomials of the numerator and denominator in equation (1). Initial estimates of the poles and zeros (or coefficients) are given to optimizer 340 on input terminals 342 of optimizer 340 to initialize the optimization of ER filter 310. The initial estimates of the poles and zeros depend on such factors as media characteristics, head characteristics, and the data rate. The same conventional methods used to set the poles and zero locations in nonadaptive systems can be used for the initial estimates of an adaptive systems.

Optimizer 340 calculates the new poles and zeros (or coefficients) and sends the new estimates to a Bank of digital to analog converters (DAC) 350 on output terminal 345 of optimizer 340. Bank of DACs 350 converts the new poles and zeros (or coefficients) to analog signals to move the poles and zeros of ER filter 350. Adder 330, optimizer 340, and bank of DACs 350 can be implemented completely in hardware or firmware, software with a microcontroller or a microprocessor, or any combination thereof.

Regardless of how the optimization procedure is implemented, the ER filter parameters, namely, the poles and zeros, can be customized for a given channel (head/media combination) and data rate using the above approach. Thus, the system given in FIG. 3 can be used in multi-rate applications, such as magnetic disk-drives with constant density recording.

The design of a typical ER filter according to Equation (1) has two major shortcomings. First, the number of variable parameters might become too large. Eight to twelve parameters (2–4 zeros+6–8 poles) are required in the ER filter for each data zone and each head/media combination. Even for the simplest disk-drive configuration with one disk/two heads and sixteen data zones, the determination and storage of so many parameters is time-consuming and expensive. Therefore, conventional systems are not suited to adapt to changing conditions of the disk drive during actual operation of the disk drive.

In addition, the optimization procedure used to determine the filter parameters does not, in general, exhibit a global minimum for the cost function, typically chosen to be the mean squared-error (MSE). The initial pole/zero values must therefore be chosen carefully to avoid getting stuck in a local minima during parameter optimization.

Furthermore, the ER filter is required to be independent of environmental changes, specifically changes in the positive supply voltage $V_{cc}$ and temperature. Unfortunately the devices typically used to implement circuits in an integrated fashion have voltage and temperature dependencies. Therefore, simple integrated filters have responses dependent on voltage and temperature. To overcome this problem two main compensation schemes are used. One uses a master slave approach whereby the required filter is slaved to a separate master filter which is in turn controlled by a tuning loop with a constant input. The disadvantages of master slave tuning include the extra circuitry and power required for the master filter, generation of the known input signal, and temperature dependent mismatches between the master and slave filter characteristics.

The other compensation scheme often employed requires knowledge of the filter response as a function of voltage and temperature. The filter tuning variables are then distorted as an inverse function of temperature and voltage. The overall filter characteristic then becomes largely independent of voltage and temperature. The problem with this method is in achieving the appropriate distortion of the tuning variables in a simple fashion.

Thus there is a need for a system or method of processing the readback signal of a read channel device which is accurate, easily optimized, and self adaptive during actual operation of the storage device. Furthermore, the system should compensate for variations in temperature and voltage supply levels.

SUMMARY

In accordance with this invention, the ER filter of a readback system of a storage device is optimized. Typically the storage device is a magnetic disk drive; however, the readback system can be applied to other storage devices. The ER filter equalizes an input signal to create an equalized signal which ideally matches the characteristics of a target signal. Therefore, optimization of the ER filter reduced an error measure between the characteristics of the target signal and the characteristics of the equalized signal. Optimization of the ER filter is accomplished by reading sample values from the storage device and calculating an error measure between the sample values and ideal values. In one embodiment, a pole parameter, such as the cutoff frequency, is modified to minimize the error measure. Other embodiments also modify the zeros of the ER filter to minimize the error measure. Furthermore, the optimization can occur over several samples and use the mean square error of the samples as the error measure.

In another embodiment, the pole parameter is converted into a tuning current which is then adjusted into a bias voltage. The bias voltage is then applied to the tail transistors of the ER filter to modify the pole location of the ER filter.

The characteristics of components used to create the ER filter typically vary with temperature and supply voltage. The temperature dependency impede the optimization of the ER filter. Therefore, in some embodiments of the readback system, a temperature/voltage compensation circuit is used to generate a bias voltage which compensates for temperature and supply voltage dependencies in the ER filter.

One embodiment of the temperature/voltage compensation circuit receives a tuning current and a voltage input and outputs a bias voltage. The circuit comprises two current mirrors with the tuning current entering the first current terminal of the first current mirror. The second current terminal of the first current mirror is coupled to a third current terminal of the second current mirror. A fourth current terminal of the second current mirror is coupled to the first power terminal of a matching transistor which is biased by the input voltage. The control terminal of the matching transistor is coupled to the first terminal of the first current mirror. The bias voltage is taken from the control terminal of the matching transistor.

Functionally, the matching transistor is biased to match the biasing conditions of a target transistor in the ER filter. The current mirrors force the tuning current through the matching transistor. The voltage at the control terminal of the matching transistor is then forced to the voltage of necessary to force a current equal to the tuning current in the target transistor. Therefore, the voltage at the control terminal of the matching transistor is used as the bias voltage output.

BRIEF DESCRIPTION OF THE DRAWINGS

FIG. 9(*a*) shows a circuit diagram of one embodiment of a Gm Block.

DETAILED DESCRIPTION

Figure 1:
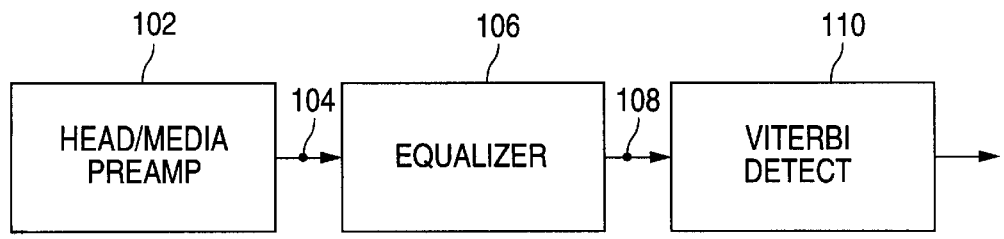
FIG. 1 shows a very high level block diagram of a partial response maximum likelihood (PRML) read back system.
Figure 2:
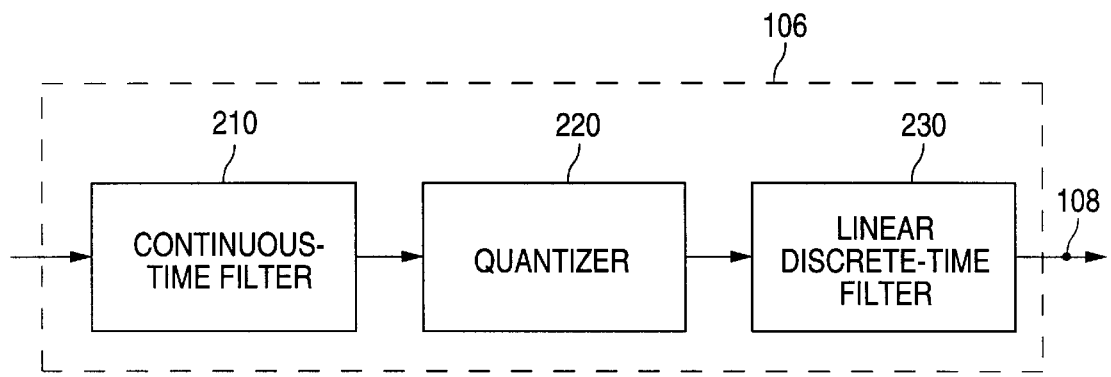
FIG. 2 shows a block diagram of a conventional equalizer.
Figure 3:
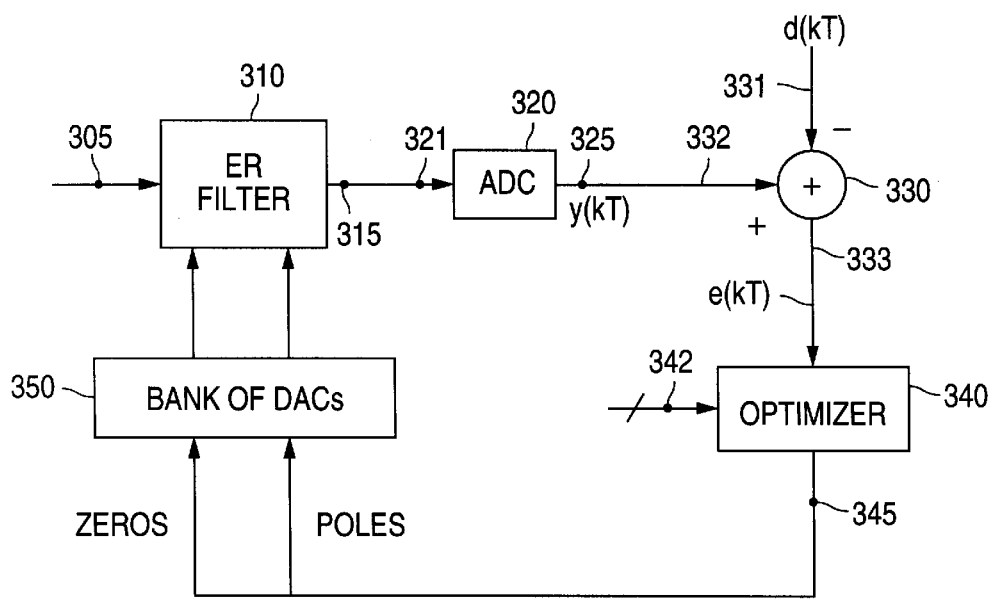
FIG. 3 shows a block diagram of a conventional equalizer optimization system.

According to the principles of this invention, the limitations imposed by conventional processing of readback signals have been overcome. An ER filter is optimized with a minimal set of parameters so that the optimal values of the parameters can be determined in real time during actual operation of the storage device. The parameters are chosen so that no localized optimal points are present. Therefore, the optimization method is able to determine the global optimal values for the parameters of the ER filter. Furthermore, temperature and voltage compensation for the ER filter is provided with a novel compensation circuit for the ER filter.

The ER filter used to generate the partial response signal is a single continuous-time filter. The filter transfer function of the ER filter can be, for example:

$$H(s) = \frac{s^2 + (Z_a - Z_b)s - Z_a Z_b}{\prod_{n=1}^{N}(s - p_n)} \quad (4)$$

where $Z_a$ and $Z_b$ are non-negative and $P_n$ are the poles of a low-pass filter transfer function. H(s) can be viewed as a cascade of an Nth-order low-pass filter with a second-order all-zero filter. The value of N may be selected to achieve a prescribed stop-band attenuation characteristic.

Assuming unit dc gain, an N-th order low-pass filter is commonly characterized by N parameters. In order to reduce the design complexity, the low-pass filter may be chosen from a variety of available filters, including Butterworth, Chebyshev, or Elliptic. Such filters are commonly characterized by one or two parameters, independent of the order of the filter. For example, any N-th order Butterworth filter is characterized by two parameters: the cutoff frequency c, and the passband roll-off. By prescribing the roll-off value, one only needs to then determine the cutoff frequency to specify the filter response. The overall design problem is, in this way, greatly simplified.

Using this principle, the implementation of the ER filter for generating a EPR4 partial response becomes easier to optimize. For the magnetic recording application, the head/media phase response is almost linear. To satisfy the overall linear phase response requirement of the EPR4 channel, a lowpass structure with a relatively linear phase response as well is used. Specifically, in one embodiment of the present invention, the ER filter is a 7-th order, 0.5 dB equiripple filter having a transfer function P(s) given by $$P(s) = 1 \Big/ \Big[ \left(\frac{s}{\omega_c}\right)^7 + d_6\left(\frac{s}{\omega_c}\right)^6 + d_6\left(\frac{s}{\omega_c}\right)^5 + \\ d_5\left(\frac{s}{\omega_c}\right)^4 + d_3\left(\frac{s}{\omega_c}\right)^3 + d_2\left(\frac{s}{\omega_c}\right)^2 + d_1\left(\frac{s}{\omega_c}\right) + d_0 \Big] \quad (5)$$

where $d_i$ are known constants. The transfer function in Equation (5) requires the determination of only one pole parameter, $\omega_c$, the cutoff frequency. Based on Equation (4) and P(s), the ER filter design and optimization problem is reduced to the optimization of three parameters: $Z_a$, $Z_b$, and $\omega_c$. These parameters can be determined using an optimization procedure described below.

Optimization of $Z_a$, $Z_b$, and $\omega_c$

The Optimization of the ER filter parameters is performed in two modes. Initialization mode, which uses a known data signal, can be performed, for example, during manufacturing of the storage device, at prescribed intervals after manufacturing, at power on, or at prescribed intervals after power on. Tracking mode, which uses unknown user data, is performed in real time during normal operation of the storage device.

Figure 4:
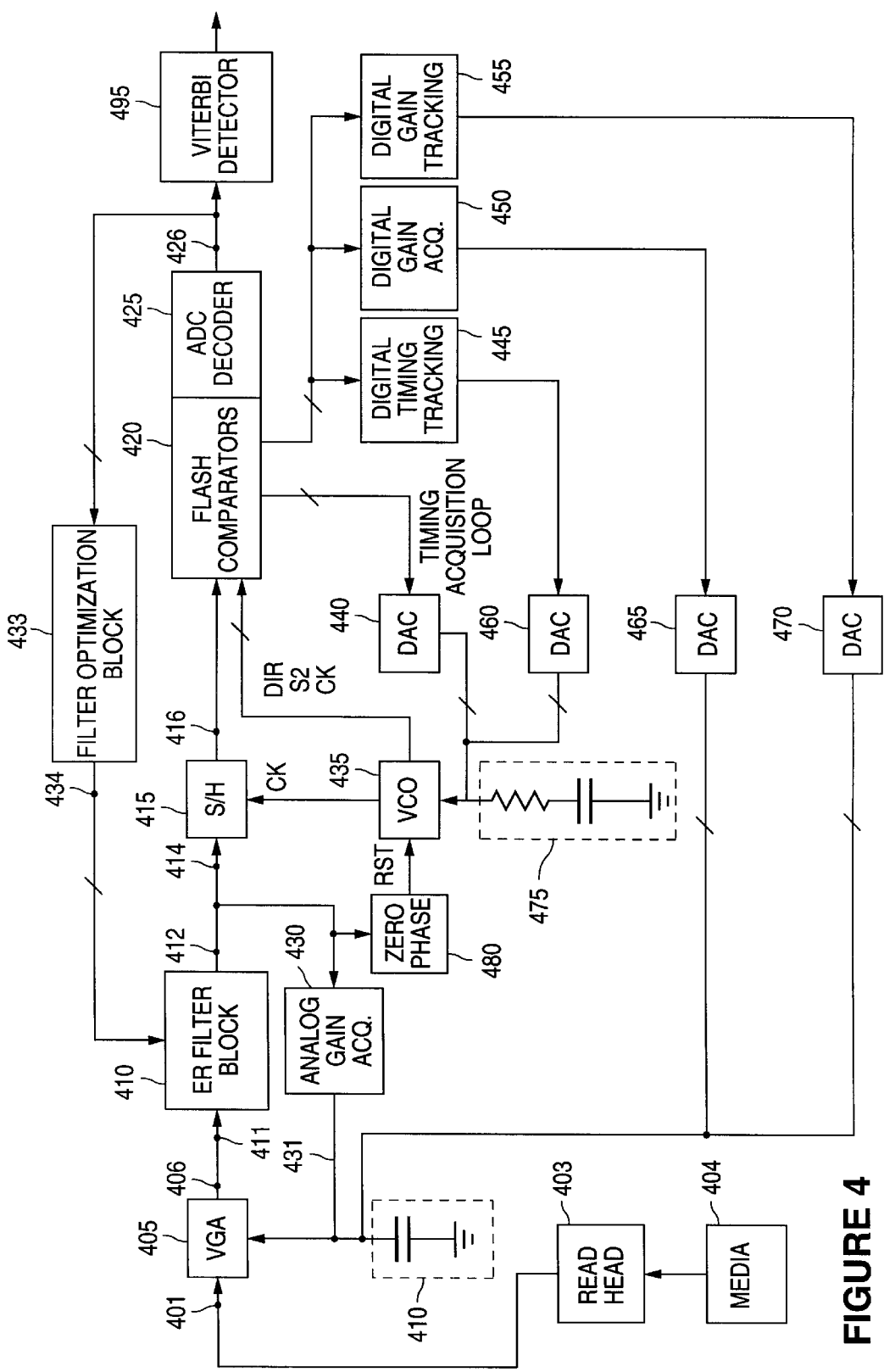
FIG. 4 shows a detailed block diagram of a PRML readback system.

FIG. 4 shows the block diagram of an EPRML readback system which incorporates one embodiment of the present invention. The EPRML readback system is ideally suited for magnetic disk drive systems. Read head 403 reads data off of media 404 to provide an analog read signal. The analog read signal is received on input terminal 401 of variable gain amplifier (VGA) 405. A VGA output signal on output terminal 406 of variable gain amplifier 405 is sent to Equalized/Receive (ER) filter block 410, which creates an equalized signal on output terminal 412 of ER filter block 410. Sample and hold circuit (S/H) 415 samples the equalized signal on input terminal 414 of Sample and hold circuit 415 to provide a stable signal on output terminal 416 of sample and hold circuit 415 for flash comparators 420. The output of flash comparators 420 is decoded by analog to digital (ADC) decoder 425 to produce a discrete time digital equalized signal on output terminal 426 of analog to digital decoder 425. The discrete time digital equalized signal is also represented as y(kT) where T is the interval of sampling and k is an integer. Digital equalized signal y(kT) is used by filter optimization block 433 to provide filter optimization parameters to ER Filter block 410 on output terminals 434 of filter optimization block 433. In one embodiment the optimization parameters are $\omega_c$, $Z_a$, and $Z_b$. Viterbi Detector 495 performs the maximum likelihood detection required to transform the digital equalized signal into user data.

Analog gain acquisition block 430, gain loop filter 490, digital gain acquisition circuit 450, digital gain tracking circuit 455, digital to analog converter 465, and digital to analog converter 470 form an automatic gain control loop to adaptively tune variable gain amplifier 405 to regulate the amplitude of the VGA output signal on output terminal 406 to a prescribed level. Methods, circuits, and techniques for facilitating operation of the automatic gain loop are described in copending, commonly filed, and commonly assigned U.S. patent application Ser. No. 08/693,587, now U.S. Pat. No. 5,796,358 entitled "METHODS AND STRUCTURE FOR COMBINED ANALOG AND DIGITAL AUTOMATIC GAIN CONTROL IN SAMPLED-DATA RECEIVERS" of Shih-Ming Shih, James W. Rae, Richard A. Contreras, and Jenn-Gang Chern, with Attorney Docket No. M-3712, which is incorporated herein by reference in its entirety.

Digital to analog converter 440, digital timing tracking circuit 445, digital to analog converter 460, loop filter 475, zero phase restart circuit 480, and voltage controlled oscillator 435 form a phase lock loop to adaptively tune sample and hold circuit 415 so that the output of ER filter block 410 is sampled with a clock synchronized to the write clock, which was used to place data on the storage device. Methods, circuits, and techniques for facilitating operation of the phase locked loop are described in copending, commonly filed, and commonly assigned U.S. patent application Ser. No. 08/695,327, now U.S. Pat. No. 5,808,573, entitled "METHODS AND STRUCTURE FOR SAMPLED-DATA TIMING RECOVERY WITH REDUCED COMPLEXITY AND LATENCY" of Shih-Ming Shih, Tzu-wang Pan, and Jenn-Gang Chern, with Attorney Docket No. M-3711, which is incorporated herein by reference in its entirety.

In one embodiment of the invention, the various blocks of FIG. 4 are implemented on a single integrated circuit with the exception of filter optimization block 433. In this embodiment, filter optimization block 433 can be implemented in hardware, firmware, software with a microcontroller or a microprocessor, or any combination thereof.

The initialization mode begins by writing a known data signal a(kT) onto the storage device. Known data signal a(kT) should be a pseudo random sequence. In one embodiment data signal a(kT) is created using generating polynomial $X^7 \oplus X^4 \oplus 1$. Initial values for the ER filter parameters $\omega_c$, $Z_a$, and $Z_b$ can be chosen by conventional off-line characterization of the filter input signal to be fairly close to the optimum settings. The readback signal from the storage device is obtained by an EPRML readback system such as the one illustrated by FIG. 4. In some embodiments of the invention, known data signal a(kT) is stored in dedicated tracks on the storage media. In other embodiments portions of a set of tracks are reserved for the initialization mode.

Figure 5:
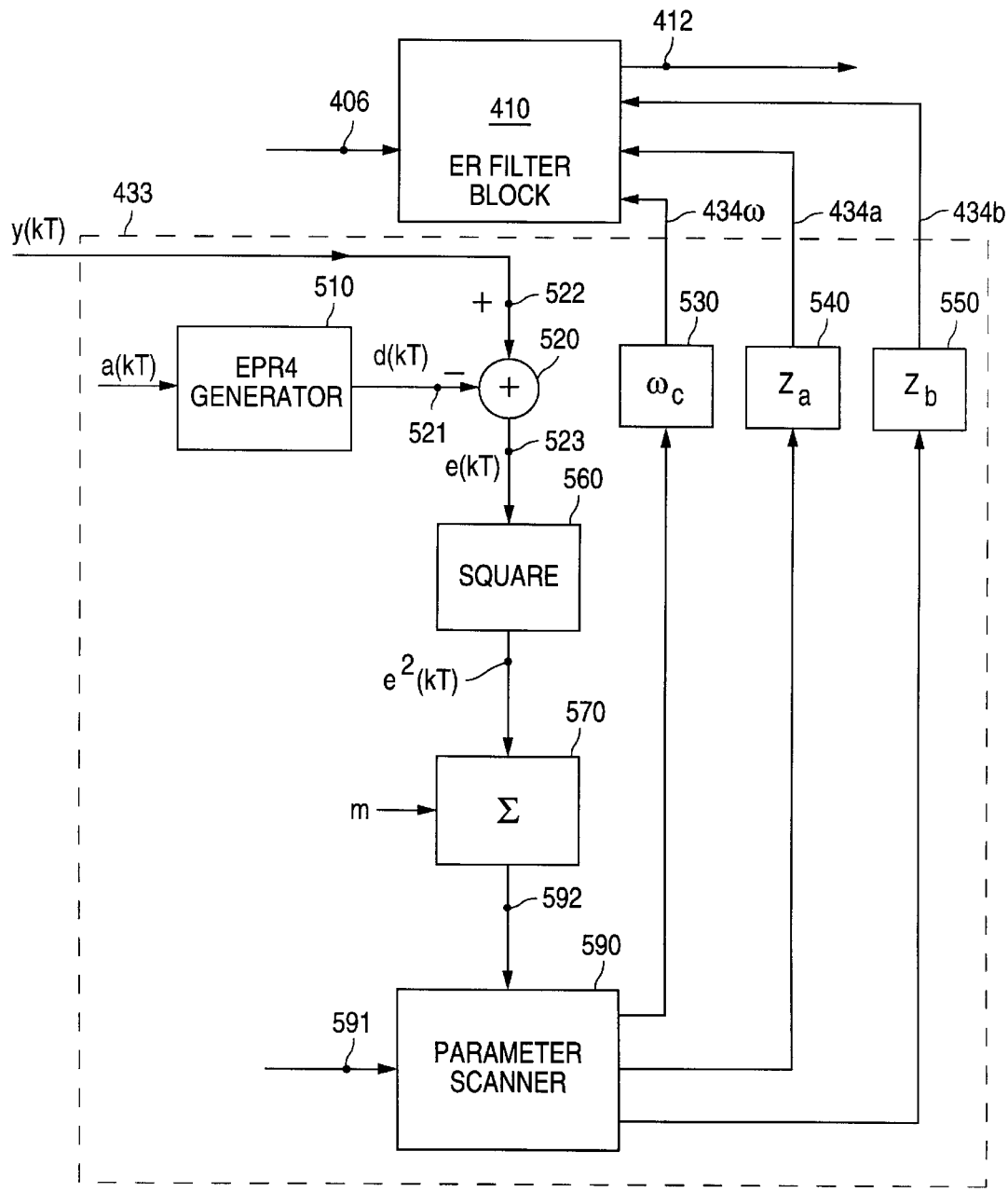
FIG. 5 shows a block diagram of an ER equalizer optimization system for initialization mode.

FIG. 5 shows a block diagram of the portion of filter optimization block 433 to optimize the ER filter using parameters $\omega_c$, $Z_a$, and $Z_b$ during the initialization mode. The ER filter optimization problem may be solved in a variety of ways. In the embodiment of FIG. 5, the minimum mean-squared error (MMSE) criterion is used as an error measure, which is commonly used for adaptive digital signal processing, is used. Another embodiment might use the mean of the absolute value of the error difference for the error measure.

The mean-squared error (MSE) is defined as $$\epsilon = (1/M) \sum_{k=1}^{M} [y(kT) - d(kT)]^2 \qquad (6)$$

where y(kT) the equalized sampled signal from analog to digital converter 425, the d(kT) is the known ideal EPR4 response of the known data signal a(kT) on the storage device, and M is the number of sample points used in the averaging operation. Since equalized sampled signal y(kT) is generated from the equalized signal on output terminal 412 of ER filter block 410, equalized sampled signal y(kT) depends upon the optimizing parameters $Z_a$, $Z_b$, and $\omega_c$. Therefore, changing the values of $Z_a$, $Z_b$, and $\omega_c$ changes the values of the mean-squared error.

Specifically in FIG. 5, known data signal a(kT) is converted into known ideal EPR4 signal d(kT) by EPR4 generator 510. EPR4 generator 510 implements equation (3) given above. Adder 520 subtracts known ideal EPR4 signal d(kT) on input terminal 521 of adder 520 from equalized sampled signal y(kT) on input terminal 522 of adder 520 to generate error signal e(kT) on output terminal 523 of adder 520. Square operator 560 squares error signal e(kT) for summing operator 570. Summing operator 570 takes the squared error signal and calculates the mean square error for M data samples. Parameter scanner 590 receives the mean square error on input terminal 592. Control variables are provided to parameter scanner 590 on control input terminal 591. Various control variables include which parameter to modify, the range of the parameter, or the scanning increments of the parameter. Parameter scanner 590 modifies the value of the parameter by adding or subtracting the scanning increment of the parameters from the parameters in order to minimize the mean square error. The new value of parameter $\omega_c$ is written to storage element 530, the new value of parameter $Z_a$ is written to storage element 540, and the new value of parameter $Z_b$ is written to storage element 550. The new optimizing parameters are then passed to ER Filter block 410. In a hardware implementation storage element 530, storage element 540, and storage element 550 could be for example latches or registers. In one embodiment the optimizing parameters are digitized to eight bits.

In one embodiment of filter optimization block 433, only one parameter is optimized at a time. Specifically, $\omega_c$ is optimized to minimize the mean square error on input terminal 592 while $Z_a$ and $Z_b$ are held at the initial estimates of $Z_a$ and $Z_b$. Then $Z_a$ is optimized to minimize the mean square error on input terminal 592 while $\omega_c$ and $Z_b$ are held constant. Finally, $Z_b$ is optimized to minimize the mean square error on input terminal 592 while $\omega_c$ and $Z_a$ are held constant. The optimization can be performed by setting the value of the parameter to one low end of a possible range and then increasing the parameter by a step size to the high end of the possible range. At each step, the error measure is computed. The value of the parameter producing the smallest error measure is selected as the optimal value.

In another embodiment of filter optimization block 433 parameter scanner 590 is simplified to test only prespecified sets of the optimizing parameters. For example, the designer of the storage device can specify a few sets of parameters then parameter scanner 590 would test each prespecified set of parameters to determine which prespecified set of parameters is optimal to produce the minimum mean square error. The preselected sets are determined by conventional methods based on such factors as characteristics of the media, characteristics of the head, and the data rate.

Figure 6:
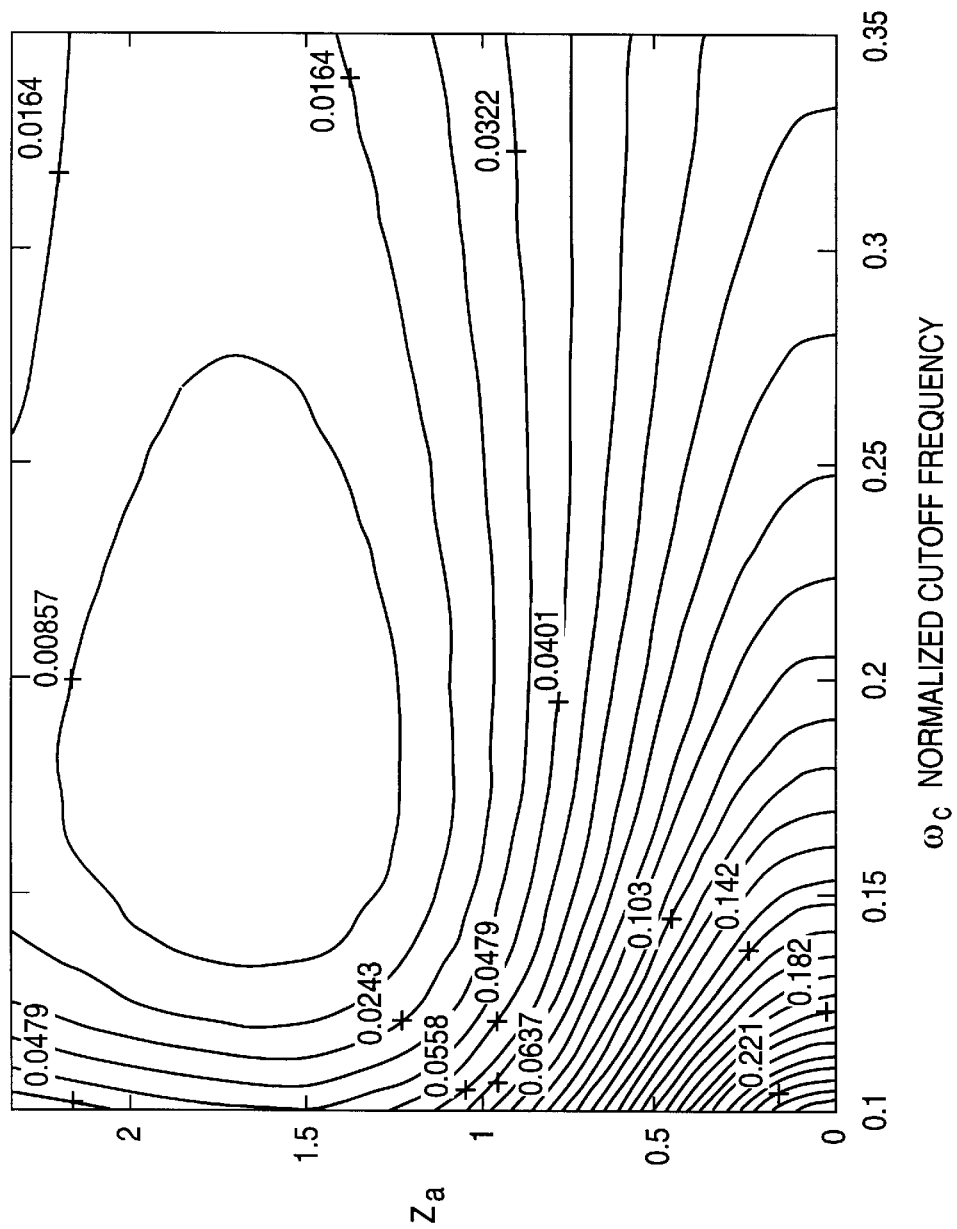
FIG. 6 shows a contour plot of the mean square error as a function of $Z_a$ and $\omega_c$.

FIG. 6 shows a contour plot of the mean square error values as a function of $Z_a$ and $\omega_c$ for a Lorentzian channel model under the assumption that $Z_b = Z_a$. Note that the MSE is a convex function of $Z_a$ and $\omega_c$. The optimum values of $Z_a$ and $\omega_c$ are defined to be the point where the mean square error is minimized. These values may be found iteratively by choosing an initial starting point and then refining the values of $Z_a$ and $\omega_c$ until the minimum mean square error is achieved. The slope of the mean square error with respect to each parameter defines whether the parameter should be increased or decreased. When the slope becomes zero, no change is made to the parameters, and their resulting values correspond to the minimum mean square error. The optimum value of $Z_b$ is determined similarly.

During actual operation of the storage device, also called tracking mode, the EPRML readback system of FIG. 4 should compensate for slow variations in the readback signal due to component aging, non-uniformity in the media, or mechanical tolerances. Therefore, the ER filter should be made adaptive to changing conditions during actual use of the storage device with customer data during tracking mode.

Figure 7:
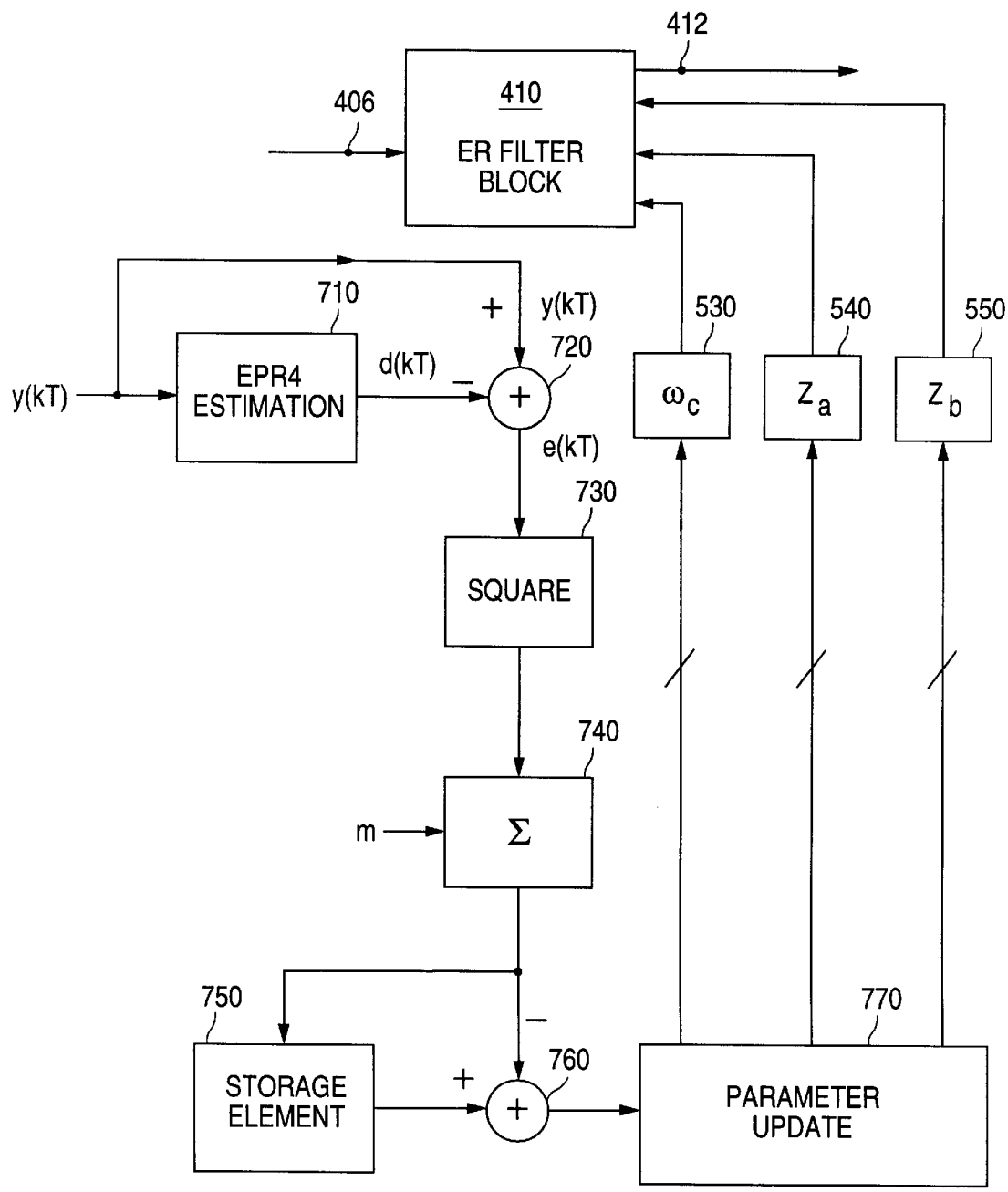
FIG. 7 shows a block diagram of an ER equalizer optimization system for tracking mode.

FIG. 7 shows a block diagram of the portion of filter optimization block 433 to optimize ER filter parameters $\omega_c$, $Z_a$, and $Z_b$ during tracking mode. The ER filter optimization problem may be solved by minimizing a variety error measures. In the embodiment of FIG. 7, the minimum mean-squared error (MMSE) criterion is used again. However, since tracking mode uses customer data instead of the known data signal a(kT), the calculation of signal d(kT) must be modified. Instead of a known ideal EPR4 response, signal d(kT) is created as an estimated EPR4 response.

As shown in FIG. 7, equalized sampled signal y(kT) is used by EPR4 estimation 710 to calculate estimated EPR4 response signal d(kT). Specifically, each data sample y(nT) is rounded to the nearest ideal EPR4 signal value. The ideal EPR4 signal values are −2, −1, 0, 1, and 2. Adder 720 subtracts estimated EPR4 signal d(kT) from equalized sampled signal y(kT) to produce difference signal e(kT). Square operator 730 squares error signal e(kT) for summing operator 740. Summing operator 740 takes the squared error signal and calculates the mean square error for M data samples. Storage element 750 stores the mean square error for M sampling interval so that adder 760 can calculate the change in the mean square error signal for parameter update 770 every M intervals.

Parameter update 770 calculates the operating parameters based on the difference between the current mean square error and the mean square error of the previous sampling interval. Specifically, the calculated parameters, denoted by $\omega_c[(n+1)T]$, $Z_a[(n+1)T]$, and $Z_b[(n+1)T]$, which represent the optimizing parameters at time $(n+1)T$, are derived by the following formulas:

$$\omega_c[(n+1)T] = \omega_c[nT] - \Delta\omega_c[(n+1)T] * \frac{[\epsilon_M(nT) - \epsilon_M[(n-1)T]]}{\Delta\omega_c(nT)} \quad (7)$$

$$Z_a[(n+1)T] = Z_a[nT] - \Delta Z_a[(n+1)T] * \frac{[\epsilon_M(nT) - \epsilon_M[(n-1)T]]}{\Delta Z_a(nT)} \quad (8)$$

$$Z_b[(n+1)T] = Z_b[nT] - \Delta Z_b[(n+1)T] * \frac{[\epsilon_M(nT) - \epsilon_M[(n-1)T]]}{\Delta Z_b(nT)} \quad (9)$$

where $\epsilon_M(nT)$ is the mean square error at time nT, $\Delta\omega_c(nT)$ is the value of a step size update function for $\omega_c$ at time nT, $\Delta Z_a(nT)$ is the value of a step size update function for $Z_a$ at time nT, and $\Delta Z_b(nT)$ is the value of a step size update function for $Z_b$ at time nT. The step size update functions control the speed of convergence. In one embodiment the step size update functions are simply constant functions. Another embodiment can use a monotonically decreasing function.

In another embodiment of the invention parameter update 770 is simplified to calculate the operating parameters using the following formulas:

$$\omega_c[(n+1)T] = \omega_c[nT] - [ \quad (10)$$
$$\Delta\omega_c[(n+1)T] * \text{sign}[\epsilon_M(nT) - \epsilon_M[(n-1)T]] * \text{sign}(\Delta\omega_c(nT))]$$

$$Z_a[(n+1)T] = Z_a[nT] - [ \quad (11)$$
$$\Delta Z_a[(n+1)T] * \text{sign}[\epsilon_M(nT) - \epsilon_M[(n-1)T]] * \text{sign}(\Delta Z_a(nT))]$$

$$Z_b[(n+1)T] = Z_b[nT] - [ \quad (12)$$
$$\Delta Z_b[(n+1)T] * \text{sign}[\epsilon_M(nT) - \epsilon_M[(n-1)T]] * \text{sign}(\Delta Z_b(nT))]$$

where sign(x) is defined as follows:

sign(x)=1: if x>0;

sign(x)=0: if x=0;

sign(x)=−1: if x<0.

Since the ER filter must be adapted in real time during tracking mode, the optimizing parameters are normally calculated in parallel. The new value of parameter $\omega_c$ is written to storage element 530, the new value of parameter $Z_a$ is written to storage element 540, and the new value of parameter $Z_b$ is written to storage element 550. The new optimizing parameters are then passed to ER Filter block 410.

While the ER filter optimization procedure for the parameters can compensate for non-ideal effects due to process variations and circuit imperfections, once the optimum parameter set is determined, the ER filter must still compensate for power supply and temperature variations over a prescribed range.

Figure 8:
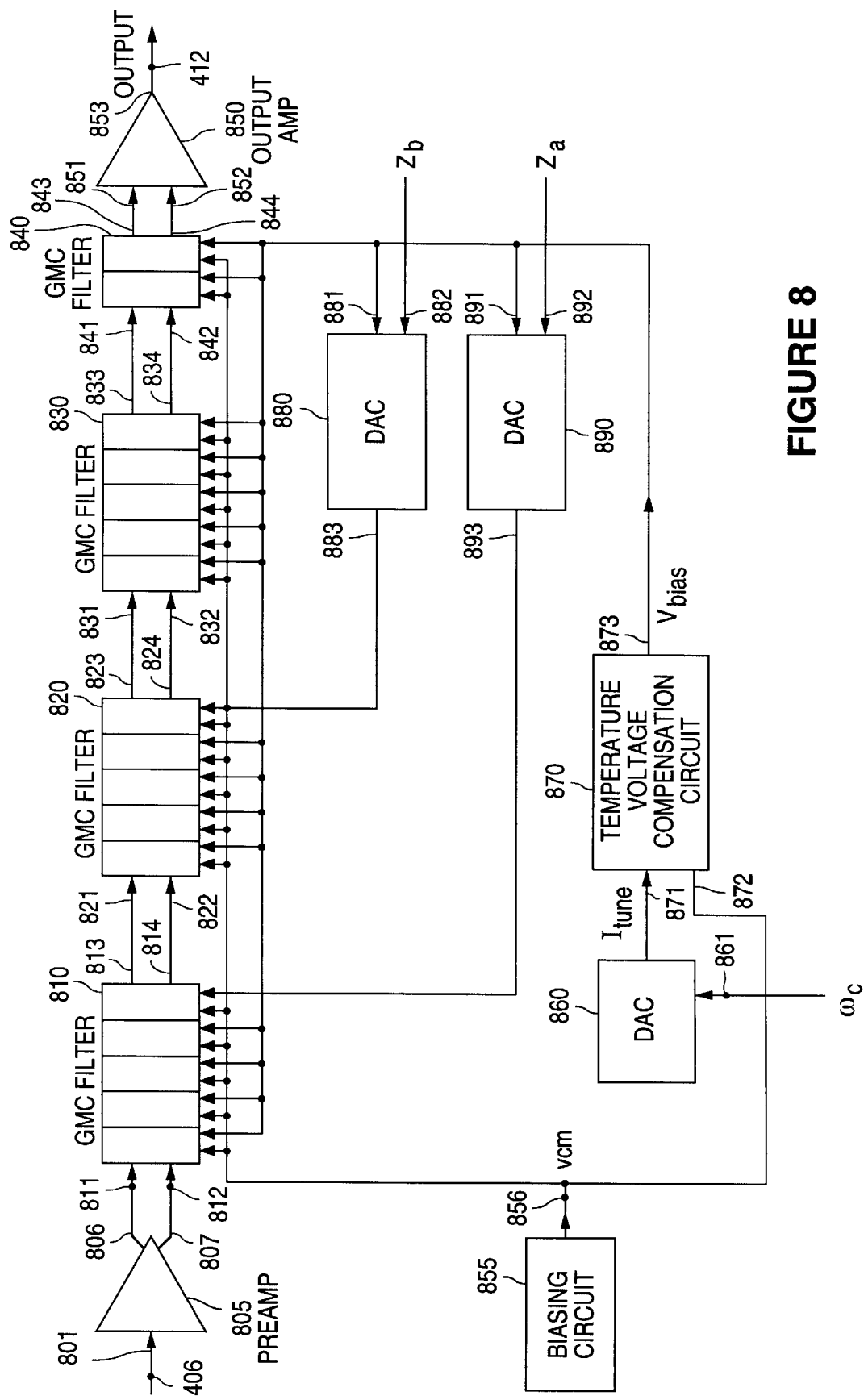
FIG. 8 shows a block diagram of an ER filter block such as ER Filter block 410 in FIG. 4 and FIG. 5.

FIG. 8 shows a detailed block diagram of ER filter block 410. The ER filter itself is formed by GmC filter 810, GmC filter 820, GmC filter 830, and GmC filter 840. Each of the GmC filters comprises multiple Gm blocks of conventional design and capacitors of conventional design. A pole of the ER filter requires two Gm blocks and one capacitor, while a zero of the ER filter requires one Gm block and one capacitor. However, in some embodiments a zero can share a capacitor with a pole. In the embodiment of FIG. 8, the ER filter is a seven pole two zero filter; therefore, 16 GmC filter blocks are required. The embodiment of FIG. 8, also uses shared capacitors for the zeros; therefore, only seven capacitors are required. Each Gm block receives the common mode voltage VCM from biasing circuit 855. In addition the Gm blocks used for the poles of the ER filter receive a biasing voltage $V_{bias}$ from temperature/voltage compensation circuit 870 to set the cutoff frequency of the ER Filter represented by $\omega_c$. Each of the GmC filter blocks used for a zero receives a biasing voltage to control the location of the zeros. Details of one embodiment of the Gm blocks are described below and depicted in FIG. 9.

Input terminal 406 (FIGS. 5 and 8) of ER filter block 410 is coupled to input terminal 801 of preamp 805. Preamp 805 further amplifies the VGA output signal received on input terminal 406 to provide a differential output voltage signal on output terminal 806 and output terminal 807 of preamp 805. GmC filter 810 has input terminal 811 coupled to output terminal 806 and input terminal 812 coupled to output terminal 807. GmC filter 810 comprises five Gm blocks and two capacitors of conventional design. Each Gm block receives the common mode voltage VCM from biasing circuit 855. In addition the first four Gm blocks of GmC filter 810 receive a biasing voltage from temperature/voltage compensation circuit 870. The first four Gm blocks of GmC filter 810 are used to control two poles of the ER filter. The fifth Gm block of GmC filter 810, which is used to control a zero of the ER filter, is controlled by digital to analog converter 890.

GmC filter 820 also comprises five Gm blocks and two capacitors of conventional design. Input terminal 821 of GmC filter 820 is coupled to output terminal 813 of GmC filter 810. Input terminal 822 of GmC filter 820 is coupled to output terminal 814 of GmC terminal 810. The Gm blocks of GmC Filter 820 are configured similarly to GmC filter 810 except that the fifth Gm block of GmC filter 820 is controlled by digital to analog converter 880. Therefore, each Gm block of GmC filter 820 receives the common mode voltage VCM from biasing circuit 855. The first four Gm blocks of GmC filter 820 receive biasing voltage $V_{bias}$ from temperature/voltage compensation circuit 870 to control two poles of the ER filter. The fifth Gm block of filter 820 controls the second zero of the ER filter.

GmC filter 830, which is used to control two poles of the ER filter, comprises four Gm blocks and two capacitors of conventional design. Input terminal 831 of GmC filter 830 is coupled to output terminal 823 of GmC filter 820. Input terminal 832 of GmC filter 830 is coupled to output terminal 824 of GmC terminal 820. Each Gm block of GmC filter 830 receives the common mode voltage VCM from biasing circuit 855. The Gm blocks of GmC filter 820 also receive a biasing voltage from temperature/voltage compensation circuit 870 to control two poles of the ER filter.

GmC filter 840, which is used to control a single pole of the ER filter, comprises two Gm blocks and one capacitor of conventional design. Input terminal 841 of GmC filter 840 is coupled to output terminal 833 of GmC filter 830. Input terminal 842 of GmC filter 840 is coupled to output terminal 834 of GmC terminal 830. Each Gm block of GmC filter 840 receives the common mode voltage VCM from biasing circuit 855. The Gm blocks of GmC filter 820 also receive biasing voltage $V_{bias}$ from temperature/voltage compensation circuit 870 to control one pole of the ER filter.

Output Amplifier 850, of conventional design, has input terminal 851 coupled to output terminal 843 of GmC filter 840 and input terminal 852 coupled to output terminal 844 of GmC filter 840. Output terminal 853 of output amplifier 850 is coupled to output terminal 412 of ER filter block 410. The equalized signal is provided by output amplifier 850 on output terminal 853.

Biasing circuit 855 provides common mode voltage VCM on output terminal 856. Common mode voltage VCM is coupled to every Gm block so that every Gm block has the same reference voltage. Common mode voltage VCM is also used by temperature/voltage compensation circuit 870. The common mode voltage is typically tied to the supply voltage level; therefore, common mode voltage VCM varies with the supply voltage. For example, in one embodiment, the common mode voltage VCM could be set to the positive supply voltage minus one volt. Since biasing circuit 855 does not compensate for temperature variations, the common mode voltage VCM also varies with the temperature.

As explained above, the ER filter can be tuned by adjusting only the three parameters $\omega_c$, $Z_a$, and $Z_b$. The poles are controlled solely by the cutoff frequency parameter $\omega_c$, while parameter $Z_a$ and parameter $Z_b$ each control one of the zeros of the ER filter. Parameter $\omega_c$ is received by digital to analog converter 860 on input terminal 861. Digital to analog converter 860 is designed to be insensitive to temperature and supply voltage variations using well known conventional techniques. Parameter $\omega_c$ is converted to an analog tuning current $I_{tune}$ on output terminal 862 of digital to analog converter 860. In some embodiments of the invention several digital to analog converters are used for parameter $\omega_c$ to create several tuning currents so that the load on each tuning current is reduced. Temperature/voltage compensation circuit 870 uses tuning current $I_{tune}$ on input terminal 871 of temperature/voltage compensation circuit 870 and common mode voltage VCM on input terminal 872 of temperature/voltage compensation circuit 870 to generate a temperature and supply voltage compensated bias voltage $V_{bias}$ on output terminal 873 of temperature/voltage compensation circuit 870. The bias voltage $V_{bias}$ is used to adjusts the poles of the ER filter based on the value of parameter $\omega_c$ in the Gm blocks. The effect of bias voltage $V_{bias}$ on the cutoff frequency of the ER filter is explained below. Bias voltage $V_{bias}$ is also used by digital to analog converter 890 so that input terminal 891 of digital to analog converter 890 is coupled to input terminal 873 of temperature/voltage compensation circuit 870. Similarly, input terminal 881 of digital analog converter 880 is coupled to output terminal 873 of temperature/voltage compensation circuit 870 to provide bias voltage $V_{bias}$ to digital to analog converter 880.

Digital to analog converter 890 converts zero parameter $Z_a$ on input terminal 892 of digital converter 890 into a first filter zero bias voltage on output terminal 893 of digital to analog converter 890. The first filter zero bias voltage adjust one of the zeros in the ER filter. Similarly, digital to analog converter 880 converts zero parameter $Z_b$ on input terminal 882 of digital converter 890 into a second filter zero bias voltage on output terminal 883 of digital to analog converter 890. The second filter zero bias voltage adjust the other zero in the ER filter. Like digital to analog converter 860, digital to analog converter 880 and digital to analog converter 890 are designed to be insensitive to variations in temperature and supply voltage using conventional techniques.

Figure 9:
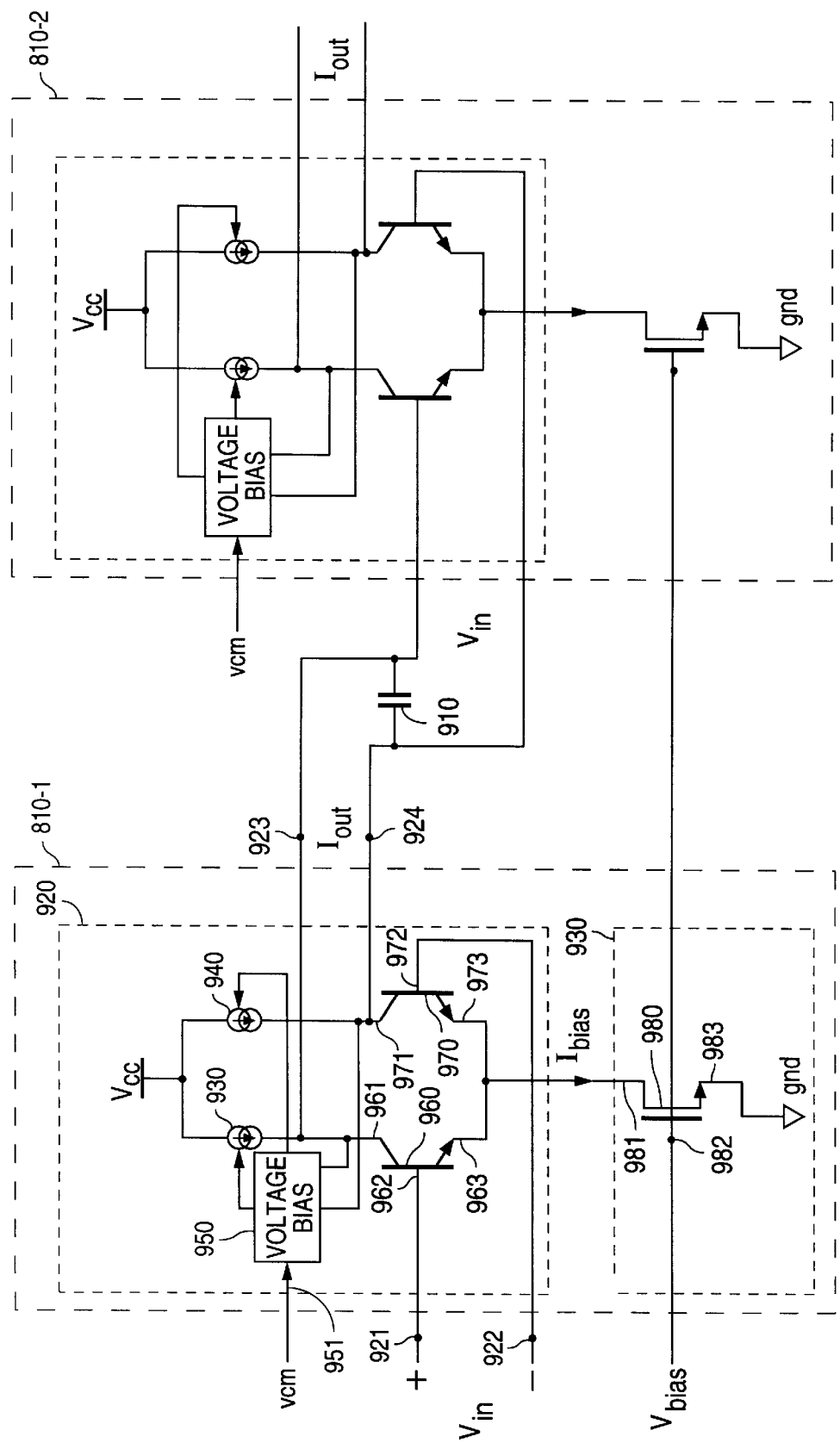
FIG. 9 shows a circuit diagram of a portion of a GmC filter.
Figure 9A:
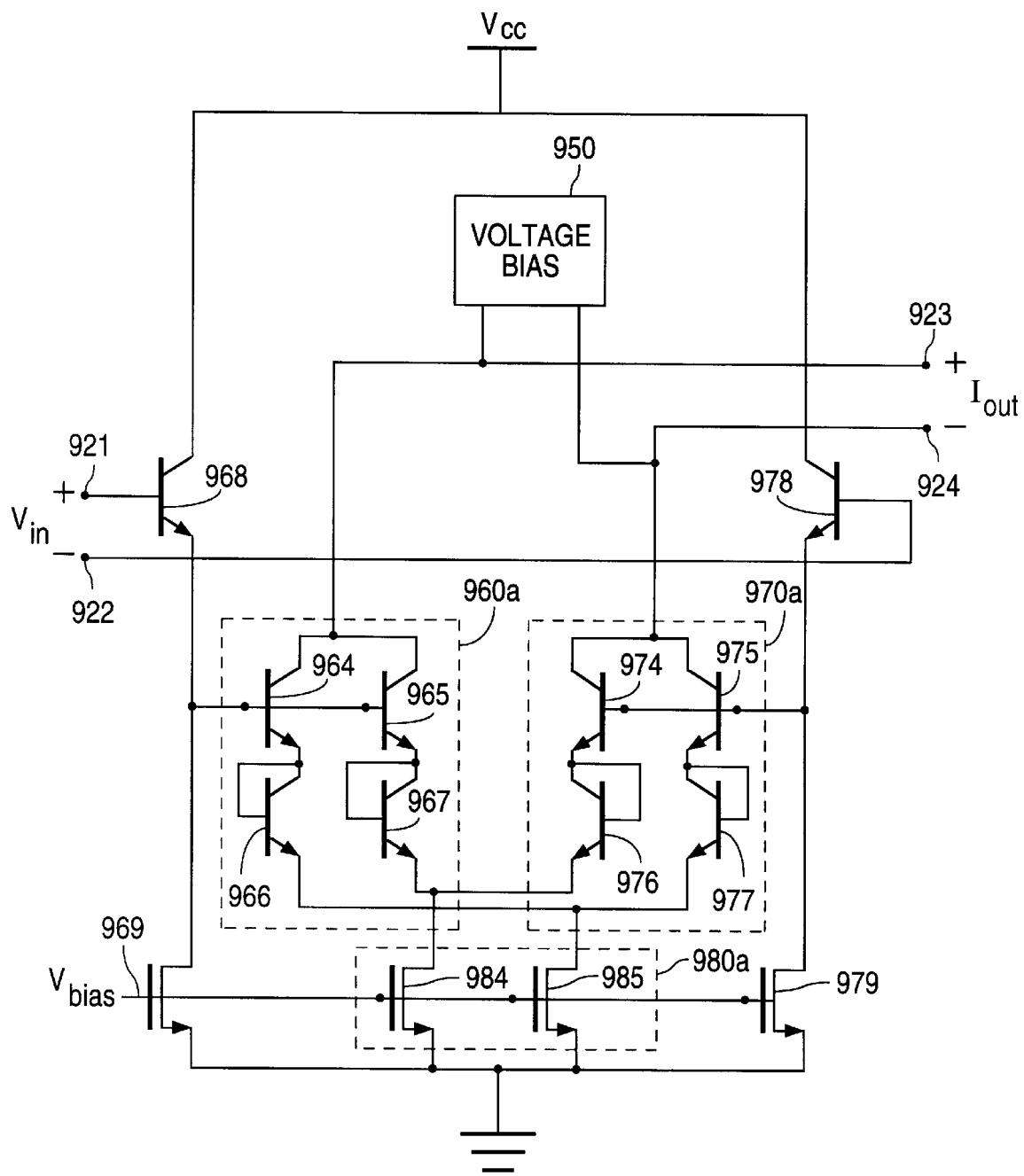

FIG. 9 shows a portion of GmC filter 810 in accordance with one embodiment of the present invention. Specifically, FIG. 9 shows first Gm block 810-1 of GmC filter 810, one pole capacitor 910, and second Gm block 810-2 of GmC filter 810. Since the functionality of first Gm block 810-1 is identical to second Gm block 810-2, only first Gm block 810-1 is described in detail. Each Gm block is a differential transconductance amplifier of conventional design.

First Gm block 810-1 can be divided into a head portion 920 and a tail portion 930. Head portion includes current source 930 coupled between positive supply voltage $V_{cc}$ and first power terminal 961 of transistor 960. Current source 930 is controlled by voltage bias circuit 950. Control terminal 962 of transistor 960 is coupled to first input voltage terminal 921. Second power terminal 963 of transistor 960 is coupled to second power terminal 973 of transistor 970 and first power terminal 981 of tail transistor 980 in tail portion 930. Control terminal 972 of transistor 970 is coupled to second voltage input terminal 922. First power terminal 971 of transistor 970 is coupled to positive supply voltage $V_{cc}$ through current source 940. Current source 940 is controlled by voltage bias circuit 950. The voltage level of first power terminal 961 of transistor 960 is controlled by voltage bias circuit 950 by adjusting the current through current source 930. Similarly, voltage bias circuit 950 also controls the voltage level on first power terminal 971 of transistor 970 by adjusting the current through current source 940. Voltage bias circuit 950 also of conventional design is controlled by common mode voltage VCM on input terminal 951 of voltage bias circuit 950. Control terminal 982 of tail transistor 980 is coupled to bias voltage $V_{bias}$ output terminal 873 (FIG. 8) of temperature/voltage compensation circuit 870. Second power terminal 983 of tail transistor 980 is coupled to ground. The output of the Gm block is provided on first current output terminal 923, which is coupled to first power terminal 961 of transistor 960, and second current output terminal 924, which is coupled to first power terminal 971 of transistor 970.

In the embodiment of FIG. 9, transistor 960 is a bipolar transistor. Therefore, first power terminal 961 is a collector terminal, second power terminal 963 is an emitter terminal, and control terminal 962 is a base terminal. Similarly, first power terminal 971 is a collector terminal, second power terminal 973 is an emitter terminal, and control terminal 972 is a base terminal. In the embodiment of FIG. 9, tail transistor 980 is a MOSFET; therefore, first power terminal 981 is a drain terminal, second power terminal 983 is a source terminal, and control terminal 982 is a gate terminal. In other embodiments, the transistor types can vary. Furthermore other embodiments of amplifiers can also be used. Techniques used in and examples of suitable conventional filters are discussed in H. Tanimoto, M. Koyama, and Y. Yoshida, "Realization of a 1-V Active Filter Using a Linearization Technique Employing Plurality of Emitter-Coupled Pairs," IEEE J. Solid-State Circuits, vol. SC-26, no. 7, pp. 937–945, July 1991 which is incorporated herein by reference.

A more detailed Gm block is shown in FIG. 9(*a*). In FIG. 9(*a*), transistor 960 (FIG. 9) is functionally replaced with block of transistors 960*a*. Specifically, block of transistors 960*a* contains transistor 964, transistor 965, transistor 966, and transistor 967 within block 960*a*. Similarly, transistor 970 (FIG. 9) is functionally replaced with block of transistors 970*a*. Specifically, block of transistors 970*a* contains transistor 974, transistor 975, transistor 976, and transistor 977 within block 970*a*. Tail transistor 980 is functionally replaced with block of transistors 980*a*. Specifically, block of transistor 980*a* contains transistor 984 and transistor 985. Transistor 968 having a control terminal coupled to first voltage input terminal 921 serves as a buffer for the voltage input. Similarly, transistor 978 having a control terminal coupled to second voltage input terminal 922, also serves as a buffer. Transistor 969 provides current drive and biasing to transistor 968. Similarly, transistor 979 provides current drive and biasing to transistor 978.

The ER filter has a response, H(jω), that is controlled as explained above by changing cutoff frequency, $\omega_c$, and zero positions via the parameters $Z_a$ and $Z_b$. The cutoff frequency of the ER filter is directly proportional to the collector currents of transistor 960 (or transistor 970). Tail bias current $I_{bias}$, which is the current through the tail transistors of the various Gm blocks, is proportional to the emitter current of transistor 960; therefore, tail bias current $I_{bias}$ is proportional to the collector current divided by the a parameter of transistor 960. Unfortunately the a parameter of a transistor varies with temperature which causes bias current $I_{bias}$ to vary with temperature. The variation of bias current $I_{bias}$ caused by temperature would cause a temperature dependence on the ER filter unless the temperature dependence of bias current $I_{bias}$ is compensated for by removing the dependence on the α parameter.

Digital to analog converter 860 generates tuning current $I_{tune}$ which is the appropriate tail current for the particular $\omega_c$ received by digital to analog converter 860. Temperature/compensation circuit 870 then creates bias voltage $V_{bias}$ which is coupled to the control terminal of each of the tail transistors to regulate the tail bias current $I_{bias}$ to be equal to tuning current $I_{tune}$. However since the a parameter varies with temperature, temperature/voltage compensation circuit 870 must compensate for a. Consequently, tail bias current $I_{bias}$ should be matched to tuning current $I_{tune}$ divided by α. A circuit to accomplish the matching is described in detail below and shown in FIG. 12.

Conventional techniques can be used to create temperature and supply invariant circuits such as the digital to analog converters. However, these techniques produce circuits that are very costly in terms of complexity and chip area. Therefore, the conventional techniques used in the digital to analog converters are less feasible for controlling the large number tail bias currents used in the ER filter. Temperature/voltage compensation circuit 870 forces the tail bias currents of the ER filter to match tuning circuit $I_{tune}$, which is insensitive to temperature and supply voltage variation. In most embodiments of temperature/voltage compensation circuit 870, tuning circuit $I_{tune}$ is forced through a matching transistor which has the same transistor characteristics of tail transistor 980. Furthermore, the drain to source voltage of the matching transistor is matched as close as possible to the drain to source voltage of tail transistor 980. The resulting gate to source voltage of the matching transistor is used as bias voltage $V_{bias}$ at the gate terminal of tail transistor 980 to cause tail bias current $I_{bias}$ to equal tuning current $I_{tune}$.

Figure 10:
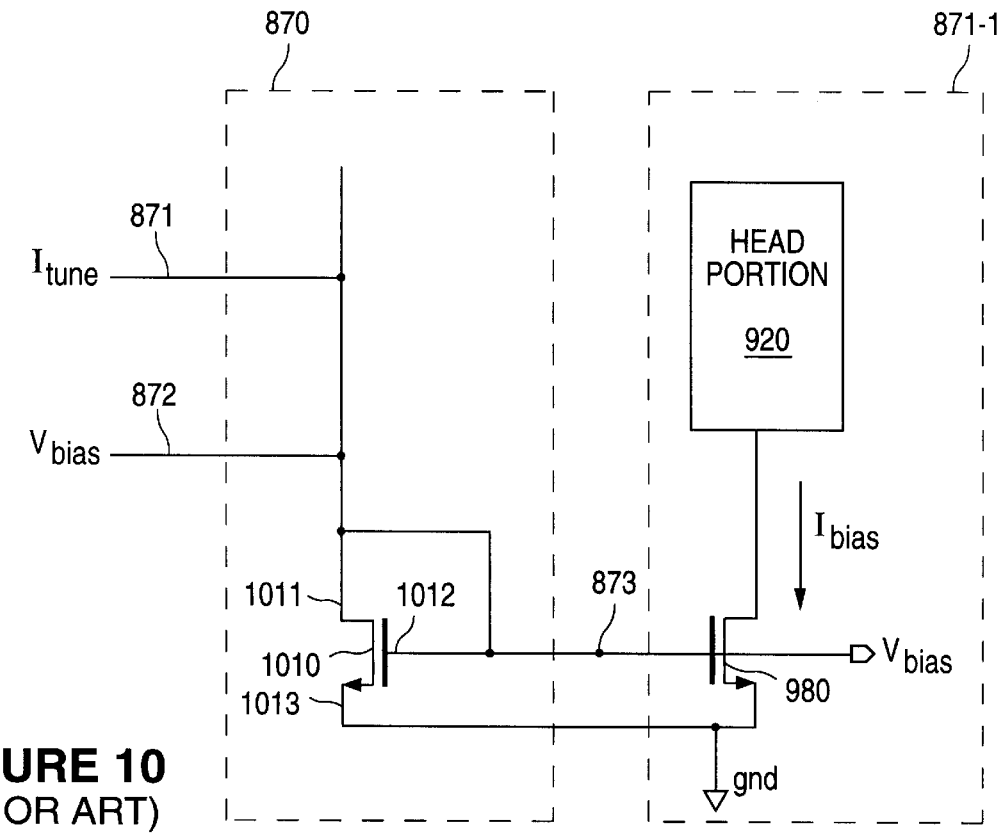
FIG. 10 shows a transistor level circuit diagram for a conventional temperature/voltage compensation circuit.

FIG. 10 shows a conventional design for temperature/voltage compensation circuit 870 coupled to first Gm block 811-1. Tuning current $I_{tune}$ on input terminal 871 is forced through matching transistor 1010 since drain terminal 1011 and gate terminal 1012 of matching transistor 1010 are coupled together to input terminal 871. The voltage on drain terminal 1011 of transistor 1010 is held to the bias voltage $V_{bias}$ on input terminal 872. Matching transistor 1010 is created with similar transistor characteristics as tail transistor 980. Since, gate terminal 1012 is connected to the gate terminal of tail transistor 980 and source terminal 1013 of matching transistor 1010 is connected to the source terminal of tail transistor 980, the gate source voltage $V_{GS}$ of matching transistor 1010 and tail transistor 980 are equal. Therefore, the tail bias current $I_{bias}$ through tail transistor 980 should equal tuning current $I_{tune}$ flowing through matching transistor 1010 if the drain to source voltage $V_{DS}$ of the two transistors are equal.

However the drain to source voltage of tail transistor 980 is common mode voltage VCM minus the voltage drop across transistor 960 or transistor 970 (FIG. 9) in head portion 920. If transistor 960 and transistor 970 are bipolar transistors, the voltage at the drain terminal of tail transistor 980 is common mode voltage VCM minus the base to emitter voltage $V_{BE}$, which is temperature dependent. Furthermore, the embodiment of FIG. 10 does not compensate for the α factor of transistor 960. Therefore, the conventional system of FIG. 10 can only be used if temperature compensation is not critical.

Figure 11:
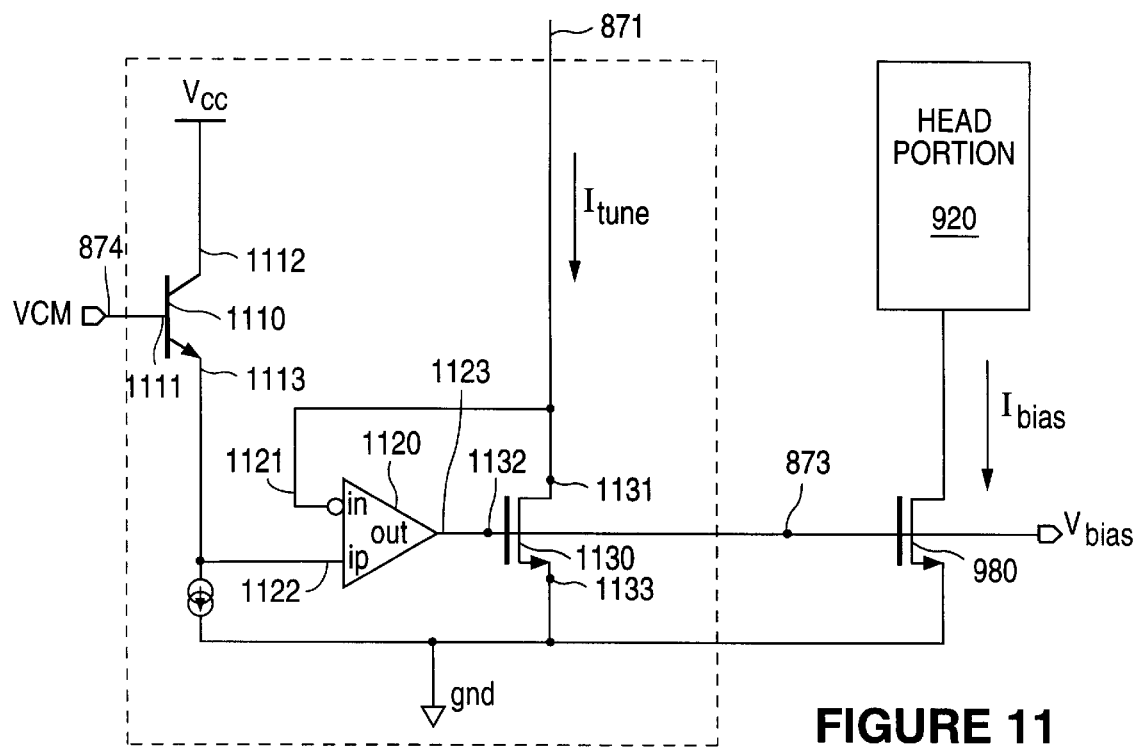
FIG. 11 shows a transistor level circuit diagram for a conventional temperature/voltage compensation circuit.

FIG. 11 shows another conventional embodiment of temperature/voltage comparison circuit 870, which provides a better match between tuning current $I_{tune}$ and tail bias current $I_{bias}$ than provided by the embodiment of FIG. 10. Input terminal 872 is coupled to base terminal 1111 of transistor 1110 so that common mode voltage VCM is placed on base terminal 1111 of transistor 1110. The voltage at emitter terminal 1113 of transistor 1110 is held to a voltage of common mode voltage VCM minus base to emitter voltage $V_{BE}$ of transistor 1110. If transistor 1110 is matched to transistor 960 and transistor 970 (FIG. 9), the voltage at emitter terminal 1113 should equal the voltage at the drain terminal of tail transistor 980.

Emitter terminal 1113 of transistor 1110 is coupled to positive input terminal 1122 of op-amp 1120. Output terminal 1123 of op-amp 1120 is coupled to gate terminal 1132 of matching transistor 1130. Negative input terminal 1121 of op-amp 1123 is coupled to drain terminal 1131 of matching transistor 1130. Since drain terminal 1131 is coupled to input terminal 871 and source terminal 1133 of matching transistor 1130 is coupled to ground, tuning current $I_{tune}$ on input terminal 871 is forced through matching transistor 1130. A feedback path is formed from output terminal 1123 of op-amp 1120 to gate terminal 1132 of matching transistor 1130 to drain terminal 1131 of matching transistor 1130 to negative input terminal 1121 of op-amp 1120. Due to the feedback path op-amp 1120 causes the voltage at negative input terminal 1121 of op-amp 1120 to equal the voltage at positive input terminal 1122 of op-amp 1120, which is equal to the voltage at emitter terminal 1113 of transistor 1110. As explained above, the voltage at emitter terminal 1113 is equal to the voltage the drain terminal of tail transistor 980. Therefore, the drain to source voltage, $V_{DS}$, of matching transistor 1130 and tail transistor 980 are equal. Since tuning current $I_{tune}$ is forced through matching transistor 1130, the voltage at gate terminal 1132 of matching transistor 1130 is at the appropriate $V_{GS}$ to allow tuning current $I_{tune}$ to flow through matching transistor 1130. Since the gate terminal 1132 is coupled to the gate terminal of tail transistor 980 the tail bias current $I_{bias}$ is equal to the tuning current $I_{tune}$. However, as explained above the α factor of transistor 960 requires that tail bias current $I_{bias}$ be matched with tuning current $I_{tune}$ divided by α. Furthermore, the feedback loops of the embodiment of FIG. 11, becomes unstable if the capacitance on output terminal 873 is large. Due to the large number of tail transistors in the ER filter output terminal 873 has a large capacitance; therefore, the embodiment of FIG. 11 is not well suited for an ER filter.

Figure 12:
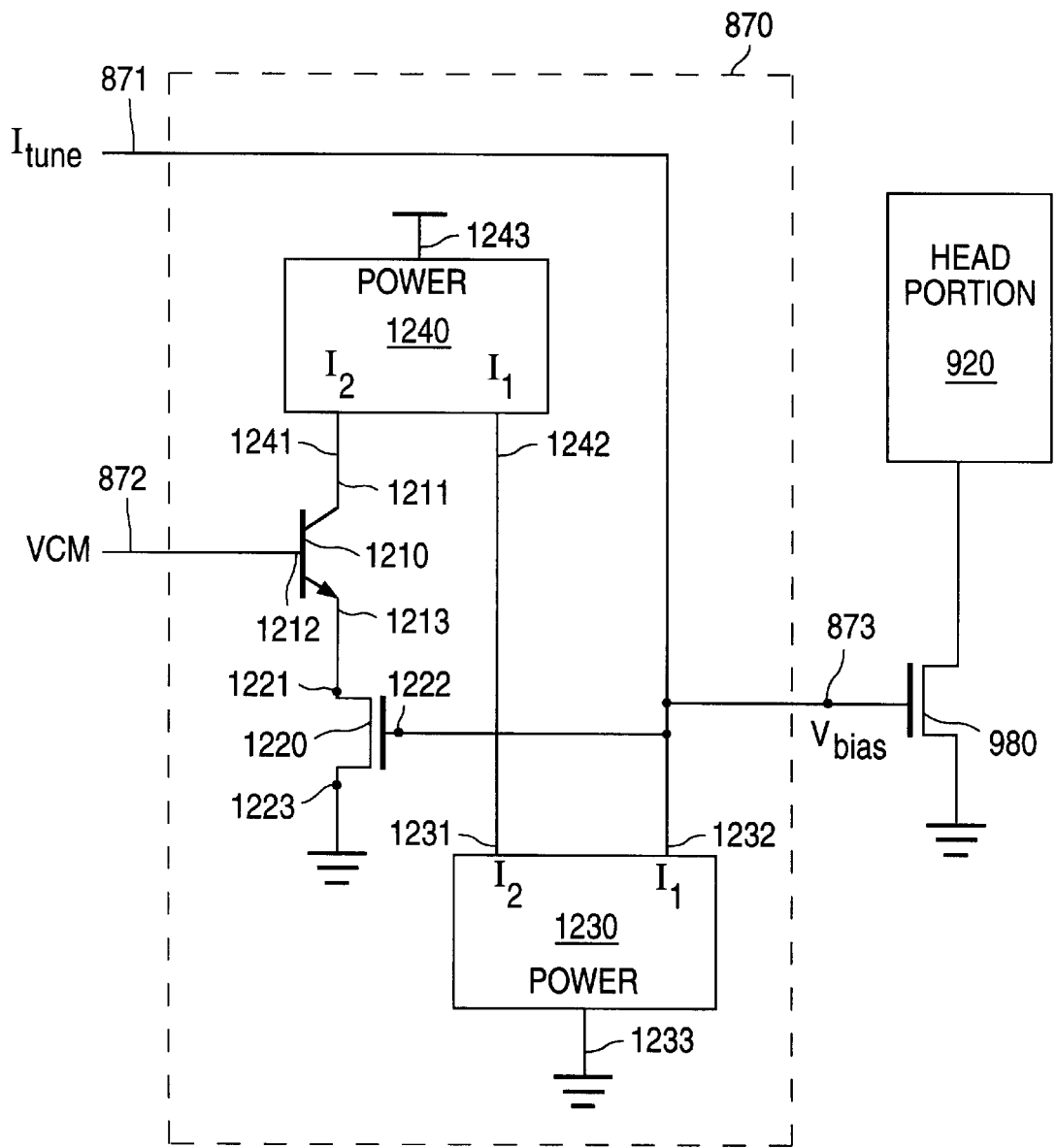
FIG. 12 shows a circuit diagram for a novel temperature/voltage compensation circuit.

FIG. 12 shows a novel embodiment of temperature/voltage compensation circuit 870. Input terminal 871 carrying tuning current $I_{tune}$ is coupled to first current terminal 1232 of first current mirror 1230. First current mirror 1230 has a power terminal 1233 coupled to ground. First current mirror 1230 also has second current 1231 coupled to first current terminal 1242 of second current mirror 1240. Second current mirror 1240 has power terminal 1243 coupled to positive supply voltage $V_{cc}$. Second current mirror 1240 also has second current terminal 1241 coupled to collector terminal 1211 of transistor 1210.

Input terminal 871 is also coupled to output terminal 873 and gate terminal 1222 of matching transistor 1220. Output terminal 873 is coupled to the gate terminal of tail transistor 980. Since source terminal 1223 of transistor 1220 is coupled to ground, the source terminal of tail transistor 980 is coupled to ground and gate terminal 1222 is coupled to the gate terminal of tail transistor 980, matching transistor 1222 and tail transistor 980 have the same gate to source voltage.

Input terminal 872 is coupled to base terminal 1212 of transistor 1210 so that common mode voltage VCM is placed on base terminal 1212. The voltage at emitter terminal 1213 of transistor 1210 is held to a voltage of common mode voltage VCM minus base to emitter voltage $V_{BE}$ of transistor 1210. As explained above with respect to FIG. 11, the resulting voltage on emitter terminal 1213, which is coupled to drain terminal 1221 of matching transistor 1220, matches the drain to source voltage of matching transistor 1220 to the drain to source voltage of tail transistor 980.

Since matching transistor 1220 and tail transistor 980 have the same gate to source voltage and drain to source voltage, tail bias current $I_{bias}$ equals the current flowing through matching transistor 1220. Since tuning current $I_{tune}$ flows into first current terminal 1232 of first current mirror 1230, tuning current $I_{tune}$ is mirrored on second current terminal 1231 of first current mirror 1230. Therefore, tuning current $I_{tune}$ flows into first current terminal 1242 of second current mirror 1240. Consequently, second current mirror 1240 mirrors tuning current $I_{tune}$ on second current terminal 1241 of second current mirror 1240. Therefore, the collector current of transistor 1210 is equal to the tuning current $I_{tune}$ and the emitter current of transistor 1210 is the tuning current $I_{tune}$ divided by the a of transistor 1210. Thus, the current flowing through transistor 1220 is tuning current $I_{tune}$ divided by the a of transistor 1210. Since tail bias current $I_{bias}$ is forced to equal the current flowing through matching transistor 1220, tail bias current $I_{bias}$ is equal to tuning current $I_{tune}$ divided by the α of transistor 1210. By matching transistor 1220 with transistor 960 the a factors cancel out to properly tune the cutoff frequency of the ER filter. Furthermore, the embodiment of FIG. 12 is actually stabilized by increasing the capacitance on output terminal 873.

Figure 13:
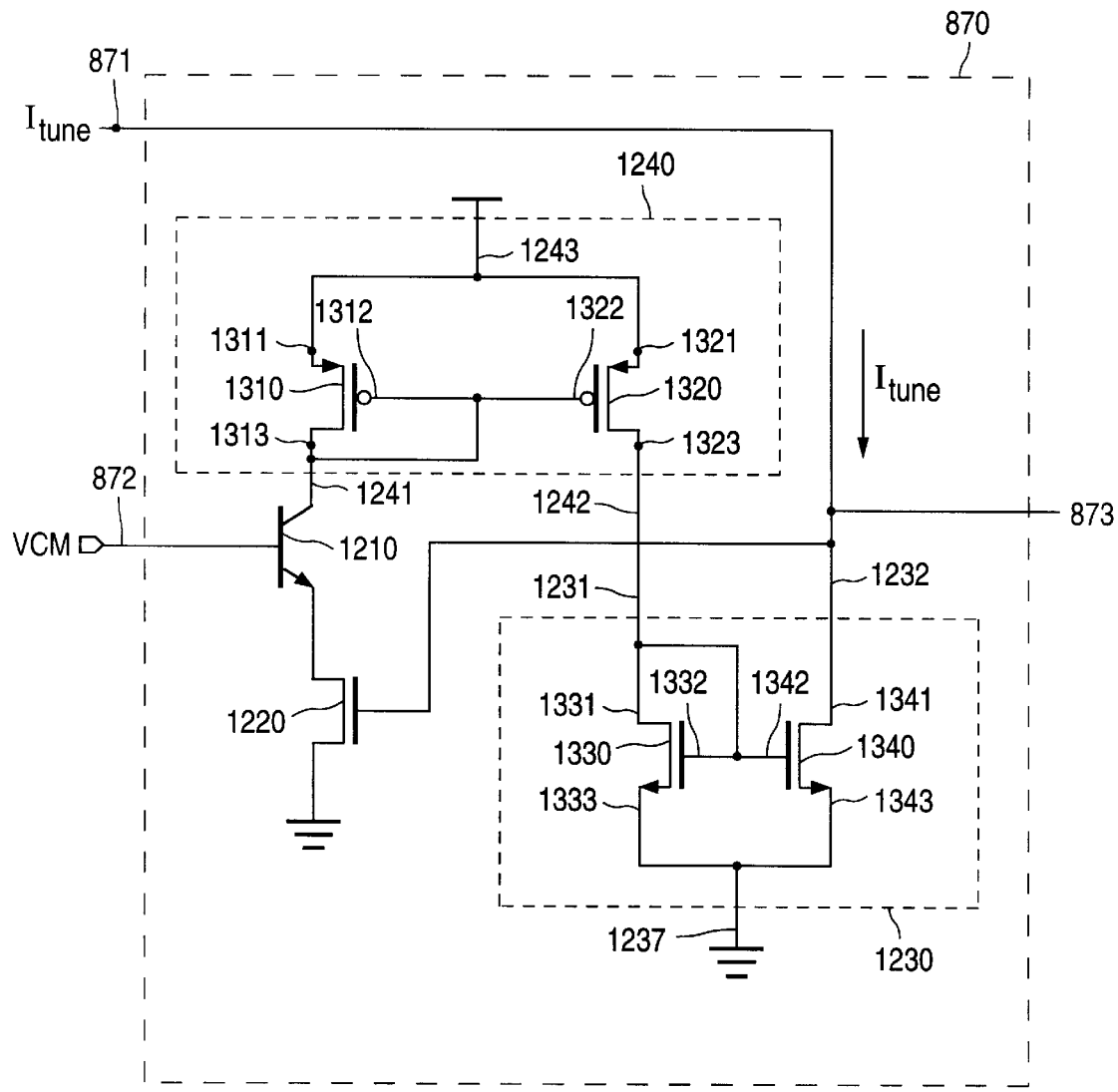
FIG. 13 shows a transistor level circuit diagram of a novel temperature/voltage compensation circuit.

The particular implementation of first current mirror 1230 and second current mirror 1240 is unimportant so long as the implementation provides matching currents on the first current terminal and the second current terminal. FIG. 13 shows one embodiment of temperature/voltage compensation circuit 870 with transistor level implementations of the current mirrors. Specifically, first current mirror 1230 comprises NMOS transistor 1330 and NMOS transistor 1340. Gate terminal 1332 of NMOS transistor 1330 is coupled to gate terminal 1342 of NMOS transistor 1340. Drain transistor 1331 of NMOS transistor 1330 is coupled to gate terminal 1332 of transistor 1330 and second current input terminal 1231. Drain terminal 1341 of NMOS transistor 1340 is coupled to first current terminal 1232. Source terminal 1333 of NMOS transistor 1330 and source terminal 1343 are coupled to power terminal 1233, which is coupled to ground.

Second current mirror 1240 comprises PMOS transistor 1310 and PMOS transistor 1322. Drain terminal 1311 of PMOS transistor 1310 and drain terminal 1321 of PMOS transistor 1320 are coupled to power terminal 1243 which is coupled to the positive supply voltage $V_{cc}$. Source terminal 1323 of PMOS transistor 1322 is coupled to first current terminal 1242. Source terminal 1313 is coupled to second current terminal 1241, gate terminal 1312 of PMOS transistor 1310, and gate terminal 1322 of PMOS transistor 1320.

Figure 14:
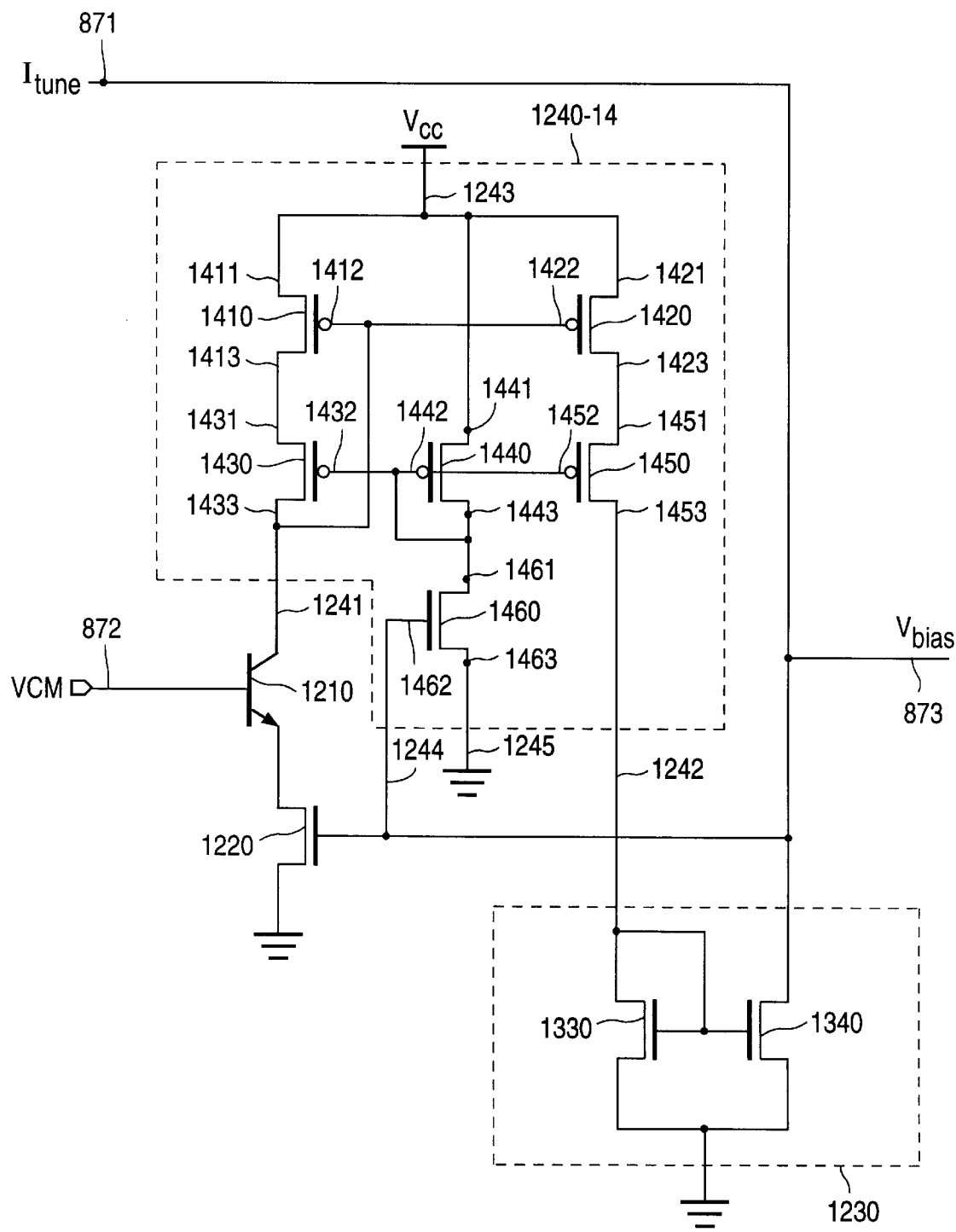
FIG. 14 shows a transistor level circuit diagram of a novel temperature/voltage compensation circuit.

FIG. 14 shows another embodiment of temperature/voltage compensation circuit 870 in which second current mirror 1240-14 incorporates cascode transistors to increase the output resistance of the transistors in current mirror 1240-14. Due to the cascode transistors second current mirror 1240-14 requires biasing terminal 1244 and second power terminal 1245. The basic function of second current mirror 1240-14 is to cause the current on first current terminal 1232 to be equal to the current on second current terminal 1241.

In second current mirror 1240-14, first current terminal 1242 is coupled to source terminal 1453 of cascode PMOS transistor 1450. Drain terminal 1451 of cascode PMOS transistor 1451 is coupled to 1423 of PMOS transistor 1420. Drain terminal 1421 of PMOS transistor 1420 is coupled to first power terminal 1243 which is coupled to the positive power supply voltage $V_{cc}$. Second current terminal 1241 is coupled to source terminal 1433 of cascode PMOS transistor 1430, gate terminal 1412 of PMOS transistor 1410, and gate terminal 1422 of PMOS transistor 1420. Source terminal 1431 of cascode PMOS transistor 1430 is coupled to source terminal 1413 of PMOS transistor 1410. Drain terminal 1411 of PMOS transistor 1410 is coupled to power terminal 1243. Biasing terminal 1244 is coupled to gate terminal 1462 of NMOS transistor 1460. Source terminal 1463 of NMOS transistor 1440 is coupled to output terminal 1245 which is coupled to ground. Drain terminal 1461 of NMOS transistor 1460 is coupled to source terminal 1443 of PMOS transistor 1440, gate terminal 1442 of PMOS transistor 1440, gate terminal 1432 of cascode PMOS transistor 1430, and gate terminal 1452 of PMOS cascode transistor 1450. Drain terminal 1441 of PMOS transistor 1440 is coupled to power terminal 1243.

As explained above with respect to FIG. 12, the current on first current terminal 1242 should equal tuning current $I_{tune}$; therefore, both cascode PMOS transistor 1450 and PMOS transistor 1420 must be biased to drive tuning current $I_{tune}$. Furthermore, the current on second current terminal 1241 should also equal tuning current $I_{tune}$; therefore, both cascode PMOS transistor 1430 and PMOS transistor 1410 must be biased to drive tuning current $I_{tune}$. The required biasing is accomplished by NMOS transistor 1460 and PMOS transistor 1440. Specifically, NMOS transistor 1460 has matching transistor characteristics with matching transistor 1220; furthermore, NMOS transistor 1460 has the same gate to source voltage as matching transistor 1220. Therefore, NMOS transistor 1460 begins to sink any charge that may exist on gate terminal 1442 which will activate PMOS transistor 1440, cascode PMOS transistor 1430, and cascode PMOS transistor 1450. Eventually the currents through the various transistors will be equalized by the current mirrors so that the current through the transistors will equal tuning Current $I_{tune}$ or tuning current $I_{tune}$ divided by the α of transistor 1210.

The various embodiments of the structure and method of this invention that are described above are illustrative only of the principles of this invention and are not intended to limit the scope of the invention to the particular embodiments described. In view of this disclosure, those skilled-in-the-art can define other filters, error measures, partial response signals, current mirrors, Gm amplifiers, GmC filters, storage elements, gradients, hardware implementations, firmware, and use these alternative elements to create a method, circuit, or system according to the principles of this invention.

We claim:

1. A method for optimizing an ER filter having a cutoff frequency and a plurality of zeros in a readback system of a storage device comprising:

determining a cutoff value for said cutoff frequency and a filter zero value for each of said zeros to form a plurality of filter zero values;

reading a plurality of sample values from said storage device, determining an ideal value associated for each of said sample values to form a plurality of M ideal values;

calculating a mean square error measure between said sample values and said ideal values;

modifying said cutoff value and each of said filter zero values to minimize said mean square error measure;

converting said cutoff value to a tuning current;

transforming each of said filter zero values to a filter zero voltage;

altering said tuning current to a bias voltage;

applying said bias voltage and each of said filter zero values to said ER filter to adjust said cutoff frequency and said zeros of said ER filter.

2. A method for optimizing an ER filter having a cutoff frequency and a plurality of zeros in a readback system of a storage device comprising:

determining a cutoff value for said cutoff frequency and a filter zero value for each of said zeros to form a plurality of filter zero values;

reading a plurality of sample values from said storage device;

determining an ideal value associated with each of said sample values to form a plurality of M ideal values;

calculating a mean square error measure between said sample values and said ideal values;

modifying said cutoff value and each of said filter zero values to minimize said mean square error measure;

converting said cutoff value to a tuning current;

altering said tuning current to a bias voltage; and applying said bias voltage and each of said filter zero values to said ER filter to adjust said cutoff frequency and said zeros of said ER filter.

3. A method for optimizing an ER filter having a cutoff frequency and a plurality of zeros in a readback system of a storage device comprising:

determining a cutoff value for said cutoff frequency and a filter zero value for each of said zeros to form a plurality of filter zero values;

reading a plurality of sample values from said storage device;

determining an ideal value associated with each of said sample values to form a plurality of M ideal values;

calculating a mean square error measure between said sample values and said ideal values;

modifying said cutoff value and each of said filter zero values to minimize said mean square error measure;

converting said cutoff value to a bias voltage;

transforming each of said filter zero values to a filter zero voltage; and applying said bias voltage and each of said filter zero voltages to said ER filter to adjust said cutoff frequency and said zeros of said ER filter.

* * * * *